(12) United States Patent
Emura

(10) Patent No.: US 11,808,968 B2
(45) Date of Patent: Nov. 7, 2023

(54) PLANAR LIGHT SOURCE

(71) Applicant: NICHIA CORPORATION, Anan (JP)

(72) Inventor: Keiji Emura, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/816,425

(22) Filed: Jul. 31, 2022

(65) Prior Publication Data

US 2022/0381970 A1     Dec. 1, 2022

Related U.S. Application Data

(63) Continuation of application No. PCT/JP2021/002658, filed on Jan. 26, 2021.

(30) Foreign Application Priority Data

| Jan. 31, 2020 | (JP) | 2020-015770 |
| May 25, 2020 | (JP) | 2020-090287 |
| Jan. 22, 2021 | (JP) | 2021-008817 |

(51) Int. Cl.
    *F21V 8/00*     (2006.01)
    *F21V 7/10*     (2006.01)
    *F21V 13/04*     (2006.01)

(52) U.S. Cl.
    CPC ............. *G02B 6/0068* (2013.01); *F21V 7/10* (2013.01); *F21V 13/04* (2013.01); *G02B 6/0055* (2013.01); *F21V 2200/20* (2015.01)

(58) Field of Classification Search
    CPC ....... G02B 6/0068; G02B 6/0055; F21V 7/10; F21V 13/04; F21V 2200/20
    See application file for complete search history.

(56) References Cited

U.S. PATENT DOCUMENTS

| 7,997,771 B2 | 8/2011 | Epstein et al. |
| 9,075,172 B2 | 7/2015 | Koh et al. |
| 2005/0265029 A1 | 12/2005 | Epstein et al. |
| 2010/0046219 A1* | 2/2010 | Pijlman ................ G02B 6/0036 |
| | | 362/235 |
| 2011/0149594 A1 | 6/2011 | Terajima et al. |
| 2012/0013811 A1* | 1/2012 | Shimizu ............... G02B 6/0055 |
| | | 348/739 |
| 2013/0148036 A1 | 6/2013 | Shimizu |

(Continued)

FOREIGN PATENT DOCUMENTS

| CN | 108701742 A | 10/2018 |
| CN | 109804284 A | 5/2019 |

(Continued)

*Primary Examiner* — Mary Ellen Bowman
(74) *Attorney, Agent, or Firm* — HUNTON ANDREWS KURTH LLP

(57) ABSTRACT

A planar light source includes a light source, a light guide member, and a sectioning member. The light guide member has a light source placement part in which the light source is disposed and a section defining part having a groove surrounding the light source placement part. The sectioning member has light reflectivity and is disposed in the section defining part. A first portion in the section defining part that is furthest from a center of the light source in a plan view has a transmittance higher than a transmittance of a second portion in the section defining part that is closest from the center of the light source in the plan view.

13 Claims, 20 Drawing Sheets

(56) References Cited

U.S. PATENT DOCUMENTS

| | | | |
|---|---|---|---|
| 2018/0335559 A1 | 11/2018 | Cho | |
| 2019/0049651 A1 | 2/2019 | Yamamoto et al. | |
| 2019/0294004 A1 | 9/2019 | Hashimoto | |
| 2019/0324184 A1 | 10/2019 | Cai et al. | |
| 2020/0049877 A1* | 2/2020 | Watanabe | G02B 6/0025 |
| 2021/0141142 A1* | 5/2021 | Fukai | G02B 6/0031 |
| 2021/0247051 A1* | 8/2021 | Nakabayashi | G02B 6/0021 |
| 2021/0247053 A1* | 8/2021 | Nakabayashi | G02B 6/0033 |

FOREIGN PATENT DOCUMENTS

| | | |
|---|---|---|
| JP | 2008503034 A | 1/2008 |
| JP | 2008140653 A | 6/2008 |
| JP | 2010524184 A | 7/2010 |
| JP | 2011204566 A | 10/2011 |
| JP | 2018101521 A | 6/2018 |
| JP | 2019175846 A | 10/2019 |
| JP | 2019530967 A | 10/2019 |
| JP | 2019194985 A | 11/2019 |
| TW | 201911557 A | 3/2019 |
| TW | I653477 B | 3/2019 |
| TW | 201947301 A | 12/2019 |
| WO | 2012029600 A1 | 3/2012 |
| WO | 2017169123 A1 | 10/2017 |
| WO | 2018221657 A1 | 12/2018 |
| WO | 2019217408 A1 | 11/2019 |

* cited by examiner

PLANAR LIGHT SOURCE

CROSS-REFERENCE TO RELATED APPLICATION

This is a continuation application of International Application No. PCT/JP2021/002658, filed Jan. 26, 2021, which claims priority to Japanese Patent Application No. 2020-015770 filed on Jan. 31, 2020, Japanese Patent Application No. 2020-090287 filed on May 25, 2020, and Japanese Patent Application No. 2021-008817 filed on Jan. 22, 2021, the disclosures of which are hereby incorporated by reference in their entireties.

BACKGROUND

The present disclosure relates to a planar light source.

Planar light sources in which light sources and light guide members are combined have been widely utilized, for example, as backlights for liquid crystal displays. U.S. Pat. No. 7,997,771 discloses providing grooves in the light guide plate and disposing a reflecting member in the grooves for the purpose of sectioning the light emission regions per light source.

One of the objects of certain embodiments is to provide a planar light source in which luminance non-uniformity in light emission regions is reduced.

According to one embodiment, a planar light source includes a light source, a light guide member, and a sectioning member. The light guide member has a light source placement part in which the light source is disposed and a section defining part having a groove surrounding the light source placement part. The sectioning member has light reflectivity and disposed in the section defining part. A first portion in the section defining part that is furthest from a center of the light source in a plan view has a transmittance higher than a transmittance of a second portion in the section defining part that is closest from the center of the light source in the plan view.

According to another embodiment, a planar light source includes a light source, and a peripheral part surrounding the light source and having a sectioning member having light reflectivity. The light source is covered by a light guide member. A first portion in the peripheral part that is furthest from a center of the light source in a plan view has a transmittance higher than a transmittance of a second portion in the peripheral part that is closest from the center of the light source in the plan view.

According to the embodiments, a planar light source in which luminance non-uniformity in light emission regions is reduced can be provided.

EMBODIMENTS

Figure 1:
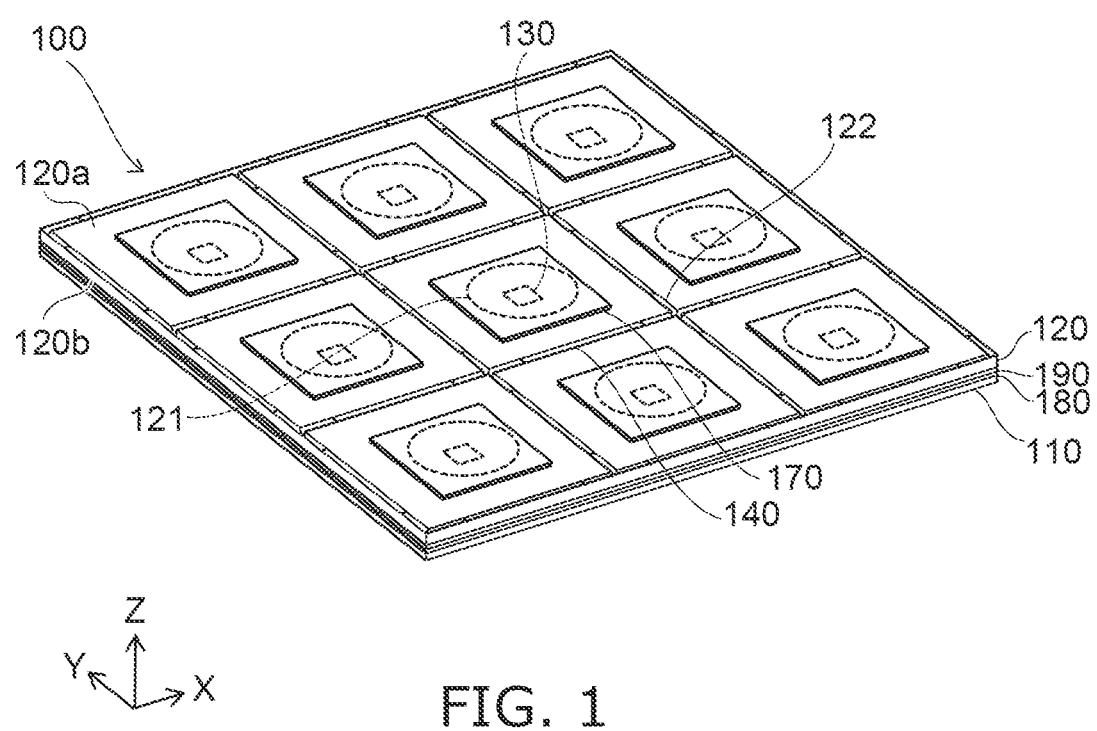
FIG. 1 is a perspective view of a planar light source according to a first embodiment.

In the present disclosure, for the purpose of explanation, an XYZ orthogonal coordinate system is employed. As shown in FIG. 1, for example, the direction from the wiring substrate 110 to the light guide member 120 is denoted as the "Z direction." The Z direction will also be referred to as the "upward direction," and the opposite direction will also be referred to as the "downward direction." One of the directions orthogonal to the Z direction is denoted as the "X direction." The direction orthogonal to both the Z and X directions is denoted as the "Y direction."

First Embodiment

A planar light source 100 according to a first embodiment will be explained.

FIG. 1 is a perspective view of the planar light source according to the embodiment.

Figure 2:
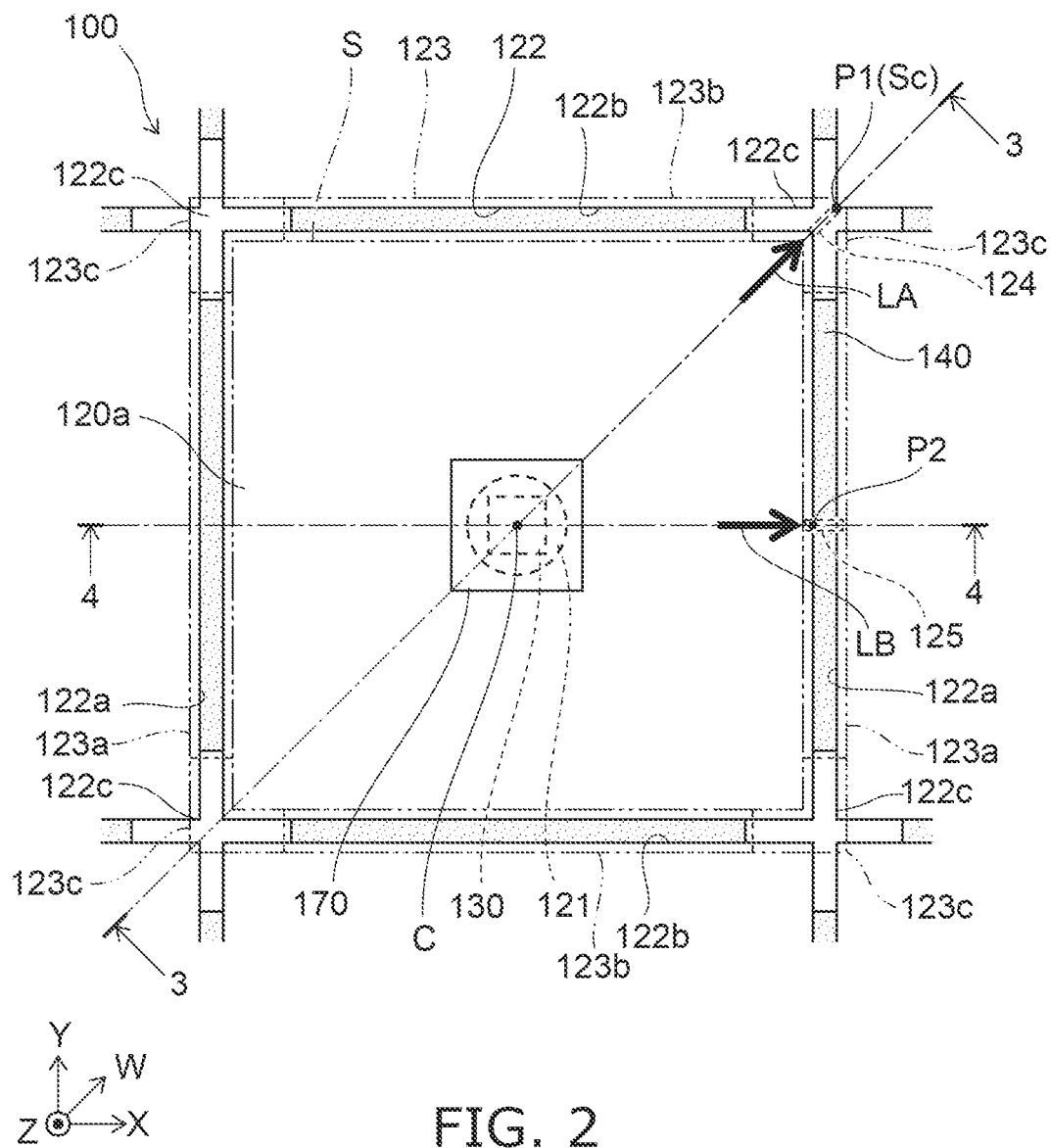
FIG. 2 is an enlarged plan view of the planar light source according to the first embodiment.

FIG. 2 is an enlarged plan view of the planar light source according to the embodiment.

Figure 3A:
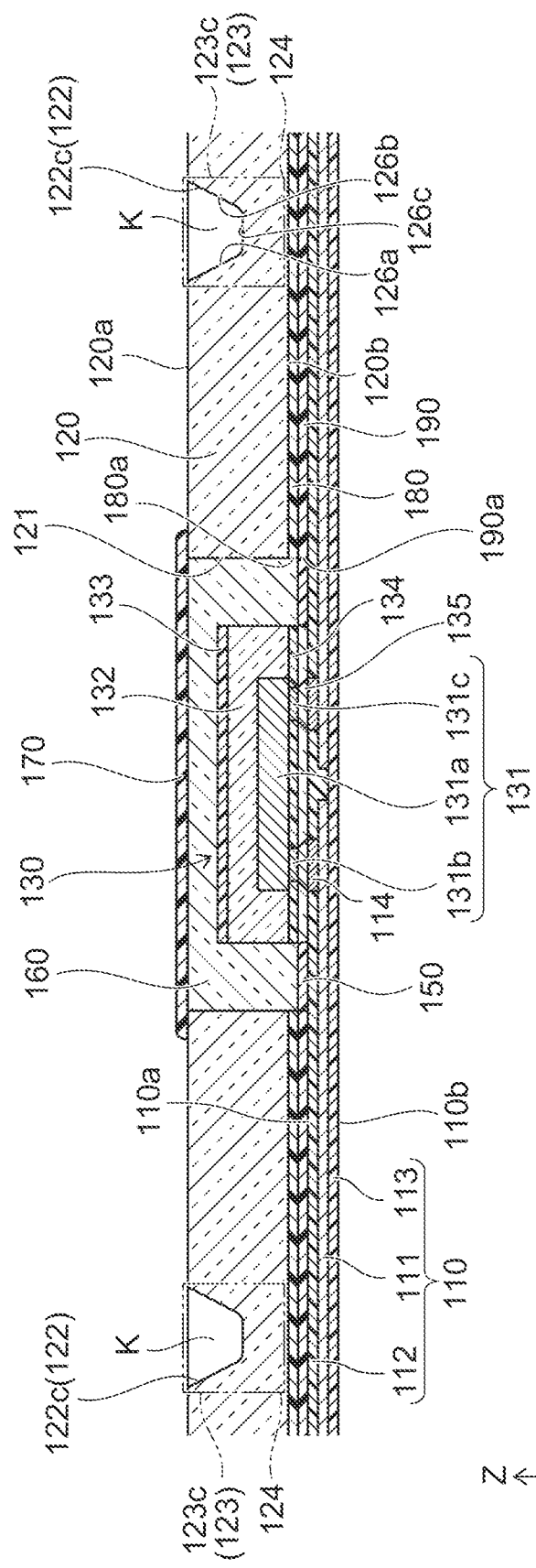
FIG. 3A is an exemplary cross-sectional view taken along line 3-3 in FIG. 2.

FIG. 3A is an exemplary cross-sectional view taken along line 3-3 in FIG. 2.

Figure 3B:
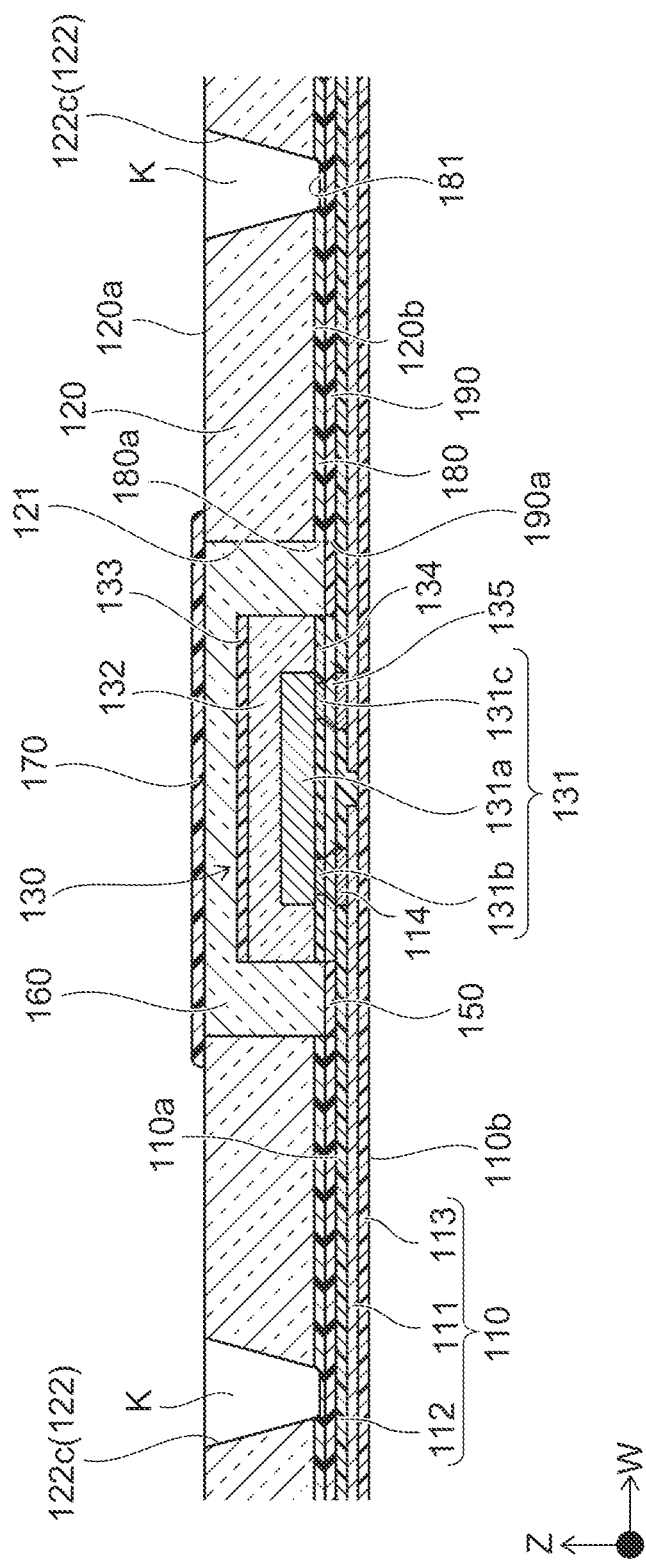
FIG. 3B is another exemplary cross-sectional view taken along line 3-3 in FIG. 2.

FIG. 3B is another exemplary cross-sectional view taken along line 3-3 in FIG. 2.

Figure 4A:
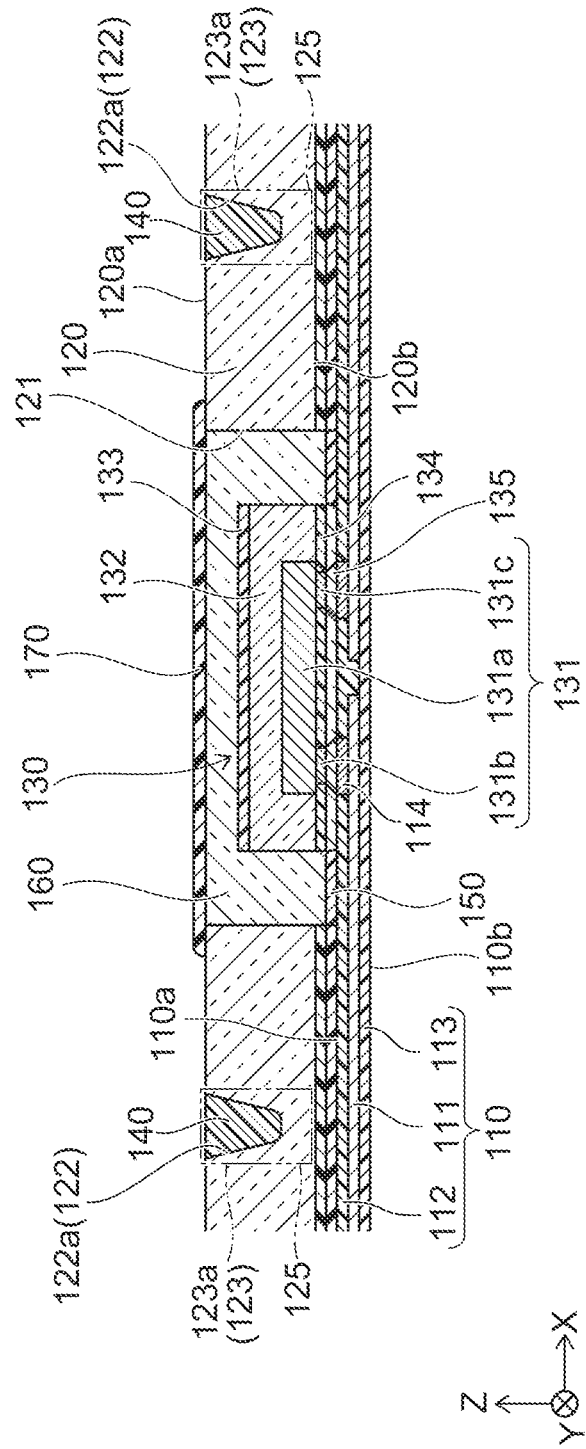
FIG. 4A is an exemplary cross-sectional view taken along line 4-4 in FIG. 2.

FIG. 4A is an exemplary cross-sectional view taken along line 4-4 in FIG. 2.

Figure 4B:
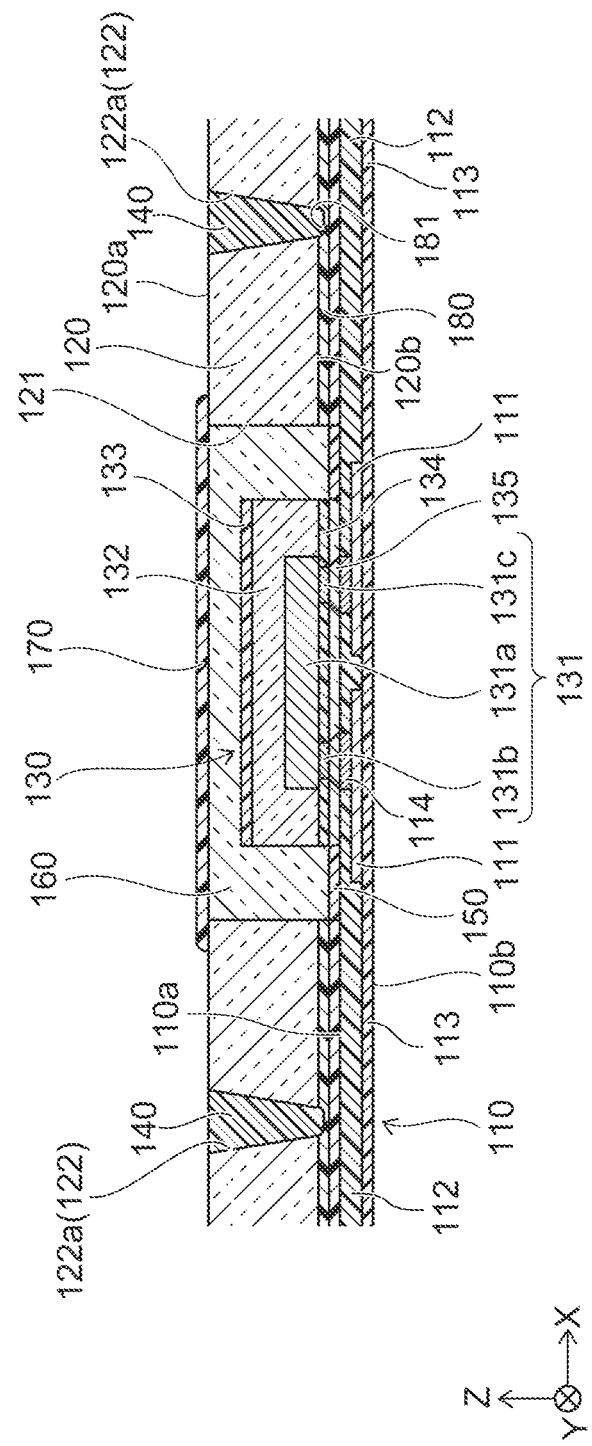
FIG. 4B is another exemplary cross-sectional view taken along line 4-4 in FIG. 2.

FIG. 4B is another an exemplary cross-sectional view taken along line 4-4 in FIG. 2.

As shown in FIG. 1, the planar light source 100 includes a wiring substrate 110, a light guide member 120, light sources 130, and a light reflecting sectioning member 140. The planar light source 100, as shown in FIG. 3A and FIG. 4A, further includes a light reflecting member 150, a first light transmissive member 160, and a first light adjusting member 170. The planar light source 100 further includes a light reflecting sheet 180 and an adhesive sheet 190. The light reflecting sectioning member 140 might simply be referred to as the "sectioning member 140" on occasion.

Each part of the planar light source 100 will be described in detail below. As shown in FIG. 1, an example which includes multiple light sources 130 arranged in the X and Y directions in the planar light source 100 will be explained below. However, the number of light sources 130 to be arranged can be one or more, i.e., not limited to the number shown in FIG. 1. Moreover, the examples of a planar light source described below arranges on a single wiring substrate 110 a single light guide member 120 that has as many light source placement parts 121 as the light sources 130. However, in a planar light source 100, a plurality of light guide members each having a smaller plan view size than that of the wiring substrate 110 may be arranged on a single wiring substrate 110. When a large sized planar light source is needed, a planar light source device in which multiple planar light sources 100 are arranged may be produced.

As shown in FIG. 3A and FIG. 4A, the wiring substrate 110 has a wiring layer 111, a first cover layer 112 formed of a resin material and covering the upper face of the wiring layer 111, and a second cover layer 113 formed of a resin material and covering the lower face of the wiring layer 111. Pads 114 may be provided on the upper face of the wiring layer 111 in the regions for connection with the electrodes 131b and 131c of the light sources 130 via conductive bonding members 135. The pads 114, for example, can be of plated layers composed of a Ni layer and an Au layer.

The structure of the wiring substrate 110 is not limited to this. For example, an adhesive layer (not shown) may be disposed between the wiring layer 111 and the cover layer 112, and between the wiring layer 111 and the cover layer 113. The examples shown in FIG. 3A and FIG. 4A have a single wiring layer 111, but multiple wiring layers 111 may be disposed in the Z direction between the first cover layer 112 and the second cover layer 113. In the case of providing multiple wiring layers 111 in the Z direction, an insulation layer and an adhesive layer may be disposed between two wiring layers 111 adjacent in the Z direction.

The surfaces of the wiring substrate 110 include an upper face 110a and a lower face 110b. The upper face 110a and the lower face 110b are, for example, flat faces substantially in parallel with the X and Y directions.

A light guide member 120 is provided above the wiring substrate 110. The light guide member 120 has light transmissivity with respect to the light exiting from the light sources 130. For the material for use as the light guide member 120, for example, a thermoplastic resin, such as acrylic, polycarbonate, cyclic polyolefin, polyethylene terephthalate, or polyester, a thermosetting resins such as silicone, or glass can be used.

As shown in FIG. 1, the light guide member 120, for example, is a plate shaped member. However, the light guide member 120 may be a layer instead of a plate shaped member. In the case in which the light guide member 120 is a layer, it may have a single layer or multiple layers. When the light guide member 120 is composed of multiple layers, the layers can be adhered by using a light transmissive adhesive sheet. For the material for the light transmissive adhesive sheet, the same material as that used for the light guide member 120 is preferably used so as to reduce the creation of an interface between layers.

The surfaces of the light guide member 120 include an upper face 120a and a lower face 120b positioned opposite the upper face 120a. The upper face 120a and the lower face 120b are, for example, flat faces substantially in parallel with the upper face 110a of the wiring substrate 110.

A light source placement part 121 is provided in the light guide member 120. As shown in FIG. 3A and FIG. 4A, the light source placement part 121 passes through the light guide member 120 in the thickness direction (Z direction). However, the light source placement part 121 may be a recessed part provided on the lower face 120b of the light guide member 120. The plan view shape of the light source placement part 121 may be circular as shown in FIG. 2, or quadrangular. In the case of a quadrangular shape, the corners of the quadrangle may be right angled or curved.

A light source 130 is disposed in the light source placement part 121. The light source 130 is mounted on the upper face 110a of the wiring substrate 110. The light source 130 has, for example, a light emitting element 131, a second light transmissive member 132, a second light adjusting member 133, and a cover member 134.

The light emitting element 131 has an emission part 131a and a pair of positive and negative electrodes 131b and 131c. The emission part 131a includes, for example, a semiconductor growth substrate and a semiconductor stacked structure. The semiconductor growth substrate is positioned on the upper side of the semiconductor stacked structure. The semiconductor stacked structure includes an $In_xAl_yGa_{1-x-y}N$ ($0 \leq x$, $0 \leq y$, $x+y \leq 1$) layer, and the light emitting element 131 emits blue light. Each of the electrodes 131b and 131c is bonded to the wiring substrate 110 via a conductive bonding member 135.

The emission part 131a includes a p-type semiconductor layer, an n-type semiconductor layer, and an emission layer interposed by the two. The emission layer can have a structure, such as a double heterostructure or a single quantum well (SQW) structure, or can have a group of active layers such as a multi-quantum well (MQW) structure. The emission part 131a is constructed such that it can emit visible light or ultraviolet light. The emission part 131a that includes such an emission layer can include, for example, $In_xAl_yGa_{1-x-y}N$ ($0 \leq x$, $0 \leq y$, $x+y \leq 1$).

The emission part 131a may have a structure that includes one or more emission layers between an n-type semiconductor layer and a p-type semiconductor layer, or one formed by repeating two or more structures each successively stacking an n-type semiconductor layer, an emission layer, and a p-type semiconductor layer. When the emission part 131a includes multiple emission layers, the emission layers may include those that emit light having the same peak emission wavelength or different peak emission wavelengths. Having the same peak emission wavelength means to include cases in which the peak emission wavelengths vary by about several nanometers. A combination of peak emission wavelengths for the multiple emission layers can be suitably selected. For example, in the case in which the emission part 131a includes two emission layers, they can be selected in combinations, such as blue light and blue light, green light and green light, red light and red light, ultraviolet light and ultraviolet light, blue light and green light, blue light and red light, green light and red light, or the like. Each emission layer may include multiple active layers emitting light of different peak emission wavelengths or multiple active layers emitting light of the same peak emission wavelength.

The second light transmissive member 132, for example, covers the upper face and the lateral faces of the emission part 131a. The second light transmissive member 132 has light transmissivity with respect to the light emitted by the emission part 131a. The second light transmissive member 132 includes, for example, a base material formed of a light transmissive material and wavelength conversion particles dispersed in the base material.

For the materials to be used as the base material, for example, a silicone resin, epoxy resin, or glass can be used. For the wavelength conversion particles, for example, a phosphor can be used. A phosphor is excited by the light emitted by the light emitting element 131 and emits light having a different wavelength from the wavelength of the light emitted by the light emitting element 131. For the phosphor, for example, yttrium aluminum garnet (YAG) based phosphors (e.g., $Y_3(Al,Ga)_5O_{12}$:Ce), β-SiAlON based phosphors (e.g., $(Si,Al)_3(O,N)_4$:Eu), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), α-SiAlON based phosphors (e.g., $Ca(Si,Al)_{12}(O,N)_{16}$:Eu), fluoride based phosphors, such as KSF-based phosphors (e.g., $K_2SiF_6$:Mn), KSAF-based phosphors (e.g., $K_2(Si,Al)F_6$:Mn), or MGF-based phosphors, nitride based phosphors (CASN-based phosphors (e.g., $CaAlSiN_3$:Eu) or SCASN-based phosphors (e.g., $(Sr,Ca)AlSiN_3$:Eu)), phosphors having a Perovskite structure (e.g., $CsPb(F,Cl,Br,I)_3$), or quantum dot phosphors (e.g., CdSe, InP, $AgInS_2$ or $AgInSe_2$) can be used. The second light transmissive member 132 may contain several types of phosphors. Combining the phosphor(s) contained in the second light transmissive member 132 and the blue light emitting light emitting element 131 allows the light source 130 to output white light. In the case in which the second light transmissive member 132 contains substantially no phosphor, the blue light from the light emitting element can be output as the light from the light source 130.

The second light adjusting member 133 reflects a portion of the light exiting from the light emitting element 131 while transmitting the other portion of the light exiting from the light emitting element 131. The second light adjusting member 133 covers the upper face of the second light transmissive member 132. The second light adjusting member 133 is a resin containing a light reflecting material, for example. Specifically, for the second light adjusting member 133, a silicone or epoxy resin that contains titanium oxide as the light reflecting material can be used. The second light adjusting member 133 may be of a single layer or two or more layers.

The cover member 134 covers the lower face of the second light transmissive member 132 and the lower face of the emission part 131a. The cover member 134 is a resin containing a light reflecting material, for example. Specifically, for the cover member 134, a silicone or epoxy resin that contains titanium oxide as the light reflecting material can be used.

As shown in FIG. 2, the plan view shape of a light source 130 is, for example, quadrangular. Hereinafter, the center C of the light source 130 in a plan view might simply be referred to as the "center C." In this embodiment, the center C is positioned at the intersection of the diagonal lines of the light source 130 in a plan view. The center C generally coincides with the center of the light source placement part 121 in a plan view.

The light source 130 may have a structure without a second light adjusting member 133. The light source 130 may have a structure without a cover member 134. The light source 130 may be composed only of a light emitting element 131, or may have a structure in which a second light adjusting member 133 is disposed on the upper face of the light emitting element 131.

The light source 130 may have a structure that includes a resin containing a light reflecting material that surrounds the lateral faces of the light emitting element 131, and a light transmissive member that covers the upper face of the light emitting element 131 and the upper face of the resin containing a light reflecting material. The light transmissive member may contain a phosphor. In this case, a light transmissive bonding member may be disposed between the light emitting element 131 and the light transmissive member.

The light source 130 described above includes one light emitting element 131, but may include multiple light emitting elements. The multiple light emitting elements may be such that they emit light of the same peak wavelength or different peak wavelengths. As a combination of light emitting elements emitting light of different peak wavelengths, for example, a red light emitting element, a blue light emitting element, and a green light emitting element can be used.

In the cross-sectional views (FIG. 4A and FIG. 4B) taken along line 4-4 in FIG. 2, the X direction width of the light source 130 can be set as 700 μm to 1000 μm, and the Z direction thickness of the light source 130 can be set as 300 μm to 400 μm. This can reduce the thickness of the light source 130. Setting the ratio of the thickness to the width of the light source 130 as 0.4 or higher can reduce the light extraction efficiency decline attributable to thickness reduction.

The X direction width of the light emitting element 131 can be set as 350 μm to 550 μm, and the Z direction thickness of the emission part 131a of the light emitting element 131 can be set as 100 μm to 200 μm. The X direction width of the second light transmissive member 132 from a lateral face of the emission part 131a of the light emitting element 131 to the facing lateral face of the second light transmissive member 132 can be set as 75 μm to 325 μm. This width is preferably set as 150 μm to 250 μm. This width is more preferably set as 180 μm to 210 μm. This can increase the width from a lateral face of the emission part 131a of the light emitting element 131 to the facing lateral face of the second light transmissive member 132 in the X direction to deal with a positional deviation from the center C of the light source 130. This can reduce the chromaticity difference between the light exiting the two lateral faces of the light emitting element 131 even when the light emitting element 131 is deviated from the center C of the light source 130 in the X direction. The Z direction thickness from the upper face of the emission part 131a to the upper face of the second light transmissive member 132 can be set as 15 μm to 215 μm. This thickness is preferably set as 50 μm to 150 μm. This thickness is more preferably set as 90 μm to 120 μm. This can secure the lateral face areas of the light source 130 for lateral emission despite its thinness, thereby improving the efficiency in extracting light from the light emitting element 131.

In the light guide member 120, a groove 122 is formed to surround a light source placement part 121 in a plan view.

As shown in FIG. 3A and FIG. 4A, the groove 122 is, for example, a recessed part created on the upper face 120a. The cross-sectional shape of the groove 122 is a trapezoid. Specifically, the groove 122 is oblique to the Z direction having a pair of lateral faces 126a and 126b which faces each other and a bottom face 126c positioned between the pair of lateral faces 126a and 126b. Each of the pair of lateral faces 126a and 126b being oblique can facilitate the transmission of the portion of the light from the light source 130 that is reflected by the lower face 120b of the light guide member 120. The transmission of light can be facilitated by the oblique lateral faces 126a and 126b because the angles of incidence for the portion of the light from the light source 130 that is reflected by the lower face 120b of the light guide member 120 are smaller than those in the case in which both of the pair of lateral faces 126a and 126b are perpendicular. The faces that connect the bottom face 126c with each of the lateral faces 126a and 126b are curved faces. The cross-sectional shape of the groove 122 is not limited to this. For example, the cross-sectional shape of the groove 122 may be quadrangular, substantially V-shaped, substantially U-shaped, or one which is narrower towards the open end. The groove 122 may pass through the light guide member 120 in the Z direction, or be a recessed part created on the lower face 120b.

In the case in which the groove 122 passes through the light guide member 120 in the Z direction, as shown in FIG. 3B and FIG. 4B, a recessed part 181 may be created in the portion of the light reflecting sheet 180 positioned directly under the groove 122. The lateral faces of the groove 122 and the lateral faces of the recessed part 181 may be coplanar. In other words, a single groove may be formed across the light guide member 120 and the light reflecting sheet 180 by the groove 122 that passes through the light guide member 120 in the Z direction and the recessed part 181.

FIG. 4B shows that the sectioning member 140 fills the groove 122 and the recessed part 181, but the structure is not limited to this, i.e., the surfaces of the groove 122 and the recessed part 181 may be covered with the sectioning member 140 in the form of a layer.

The pattern of the wiring layer 111 in the planar light source 100 is preferably formed to reduce the area that overlaps the groove 122 in a plan view. Specifically, the wiring layer 111 is preferably disposed to intersect the extended portions of the groove 122 in a plan view, rather than overlapping the extended portions of the groove 122 in the same directions in a plan view. This can reduce the risk of damaging the wiring layer 111 when the groove 122 is formed by a cutting tool such as a dicing saw.

As shown in FIG. 2, the groove 122 is provided in the planar light source 100 to form a lattice shape, for example. Accordingly, the upper face 120a of the light guide member 120 is sectioned into multiple light emission regions S by the groove 122. The shape of each light emission region is, for example, similar to the shape of a light source 130, i.e., a quadrangular shape. In a plan view, the center C is positioned at the intersection of the diagonal lines of an light emission region S. However, the groove 122 does not have to form a lattice shape, and each light emission region S does not have to have a quadrangular shape. For example, the groove 122 may be formed such that each light emission region S has another polygonal shape, such as a triangular or hexagonal shape. Furthermore, the center C does not have to be positioned at the intersection of the diagonal lines of an light emission region S. Hereinbelow, a direction in which a diagonal line of an light emission region S extends will also be referred to as a "diagonal direction W." A diagonal direction W, in FIG. 2 is a direction that forms 45 degrees with the X direction (or Y direction) in the XY plane.

The groove 122 around one light source 130 has, for example, two first groove parts 122a extending in the Y direction, two second groove parts 122b extending in the X direction, and four connecting groove parts 122c connecting the first groove parts 122a and the second groove parts 122b.

Hereinbelow, a portion of the light guide member 120 that includes the groove 122 and surrounds a light emission region S in a plan view will be referred to as a "section defining part 123." In this embodiment, the groove 122 is a recessed part created on the upper face 120a of the light guide member 120 that continuously surrounds an light emission region S. Accordingly, a section defining part 123, as shown in FIG. 3A and FIG. 4A, is configured of the groove 122 and the portion of the light guide member 120 positioned directly under the groove 122.

In the case in which the groove 122 is a recessed part created on the lower face 120b of the light guide member 120 that continuously surrounds an light emission region S, the section defining part 123 is configured of the groove 122 and the portion of the light guide member 120 positioned directly above the groove 122. In the case in which the groove passes through the light guide member 120 in the thickness direction and continuously surrounds an light emission region S, a section defining part is configured only of the groove 122. The form in which the groove does not continuously surround an light emission region will be explained in reference to the second embodiment discussed later.

As shown in FIG. 2, the section defining part 123 has first extended portions 123a, second extended portions 123b, and connecting portions 123c. The first extended portions 123a extend in the Y direction, and the second extended portions 123b extend in the X direction. The connecting portions 123c connect the first extended portions 123a and the second extended portions 123b, extending in both the X and Y directions (they are L-shaped in one section defining part 123 as shown in FIG. 2, and cross-shaped in the arrangement of multiple section defining parts 123). A connecting portion 123c can also be considered as a quadrangular portion at which the virtual extension of a first extended portion 123a overlaps the virtual extension of a second extended portion 123b.

The first extended portion 123a is configured of the first groove part 122a and the portion in the light guide member 120 directly under the first groove part 122a. The second extended portion 123b is configured of the second groove part 122b and the portion in the light guide member 120 directly under the second groove parts 122b. The connecting portion 123c is configured of the connecting groove part 122c and the portion in the light guide member 120 directly under the connecting groove part 122c.

Moreover, the section defining part 123 has a first portion 124 furthest from the center C and a second portion 125 closest from the center C.

In the section defining part 123, a furthest position P1 from the center C is located in a connecting portion 123c. More specifically, a furthest position P1 is located at the facing corner Sc of another light emission region S of the planar light source 100 that is adjacent in a diagonal direction W in a plan view. Thus, a first portion 124 is a portion that includes a furthest position P1 of the section defining part 123 and has a thickness in the direction orthogonal to the diagonal direction W and the Z direction.

A closest position P2 in the section defining part 123 closest from the center C is located in a first extended portion 123a or a second extended portion 123b. More specifically, a closest position P2 is located on the outline of the light emission region S met by the straight line passing the center C and in parallel to the X direction (or the Y direction) in a plan view. A second portion 125 is a portion that includes a closest position P2 of the section defining part 123, and has a thickness in the Y direction or the X direction.

Light reflecting sectioning members 140 are disposed in the groove 122 of the section defining part 123. For clarity of explanation, the areas in which the sectioning members 140 are disposed are indicated with a dot pattern. The sectioning members 140 are formed of a resin containing a light reflecting material, for example. Specifically, for the sectioning members 140, a silicone resin or epoxy resin containing titanium oxide as the light reflecting material can be used. The titanium oxide content can be set as 1 mass % to 70 mass %. The sectioning members 140 can be formed by a printing, spraying, inkjetting, or potting method. An inkjetting method can highly precisely dispose the sectioning members 140.

In the case of employing a potting method, the raw materials for the sectioning members 140 can be applied in the midpoint region of two adjacent connecting groove parts 122c, i.e., the region in a first groove part 122a or second groove part 122b intersected by the straight line from the center of the light source extending in the X or Y direction. In the case in which the raw materials for the sectioning members 140 include a liquid resin and particles of a light reflecting material, reducing the viscosity of the resin allows the resin subsequent to potting to spread in the first groove part 122a or second groove part 122b. A low viscosity allows the light reflecting material to readily sink and hardly dispersed in the resin. This can make the concentration of the light reflecting material in the region subjected to potting (i.e., near the midpoint between adjacent connecting groove parts 122c) higher than the concentration of the light reflecting material in the regions near the connecting groove parts 122c. In order to dispose the sectioning members 140 in the predetermined regions, a mask can be applied in the regions in which no sectioning member 140 is to be disposed.

The sectioning members 140 can cover the upper face 120a of the light guide member 120 in the central portions in the directions in which the first groove parts 122a and the second groove parts 122b extend. In the case in which the luminance of a midpoint region between two connecting groove parts 122c is higher than the luminance of the regions other than the midpoint region between two connecting groove parts 122c (e.g., the regions in which the connecting groove parts 122c are located), disposing the sectioning member 140 on the upper face of the light guide member in the midpoint region between the connecting groove parts 122c can reduce the luminance. At the end portions of the first groove parts 122a and the second groove parts 122b in the extending directions, the sectioning members 140 may cover the upper face 120a of the light guide member 120 or not. The width of coverage of the upper face 120a of the light guide member 120 by the sectioning member 140 may be constant, or narrowed gradually or stepwise, from the center to the ends in the directions in which the first groove parts 122a and the second groove parts 122b extend. The width of coverage of the upper face 120a of the light guide member 120 by the sectioning member 140 can be set to a value equal to or smaller than a tenth of the distance between two adjacent first groove parts 122a (or the distance between two adjacent second groove parts 122b).

In this embodiment, the cross-sectional area of the sectioning member 140 at a first portion 124 is smaller than the cross-sectional area of the sectioning member 140 at a second portion 125. "The cross-sectional area of the sectioning member 140 at a first portion 124" means the area of the sectioning member 140 in a cross section that includes a furthest position P1 from the center C and the light source (cross section taken along line 3-3 in FIG. 2). Similarly, "the cross-sectional area of the sectioning member 140 at a second portion 125" means the area of the sectioning member 140 in a cross section that includes a closest position P2 from the center C and the light source (cross section taken along line 4-4 in FIG. 2). A "cross-sectional area being smaller" includes the case in which the cross-sectional area of the sectioning member 140 at a first portion 124 is zero (0).

Specifically, as shown in FIG. 2, the sectioning members 140 are disposed in the first groove parts 122a corresponding to the first extended portions 123a and the second groove parts 122b corresponding to the second extended portions 123b. Accordingly, as shown in FIG. 4A, the sectioning members 140 are disposed in the groove 122 at the second portions 125. The sectioning members 140 may be disposed to completely fill the groove 122 at the second portions 125. Completely filling the groove 122 with the sectioning members 140 can improve the light reflecting property. In the case of filling with a sectioning member 140, the upper face of the sectioning member 140 may form a flat, convex, or concave face. The sectioning members 140 may be disposed in the first groove parts 122a entirely across the Y direction, and in the second groove parts 122b entirely across the X direction. The sectioning members 140 may cover the surfaces of the first groove parts or the second groove parts 122b in the form of a layer in a cross-sectional view. Disposing a sectioning member 140 in the form of a layer allows a portion of the light to transmit therethrough. In the case of disposing a sectioning member 140 in the form of a layer, the sectioning member 140 disposed on the bottom face 126c of the groove 122 may be larger in thickness than the sectioning member 140 disposed on the lateral faces 126a and 126b of the groove 122. The sectioning members 40 may protrude above the upper face 120a of the light guide member 120.

In contrast, as shown in FIG. 2, no sectioning member 140 is disposed in the connecting groove parts 122c. In other words, no sectioning member 140 is disposed on the connecting groove parts 122c that correspond to the connecting portions 123c, and thus the connecting portions 123c in the section defining part 123 are composed only of the light guide member 120. As shown in FIG. 3A, an air layer K, for example, is present in the connecting groove parts 122c, and all surfaces of the connecting groove parts 122c are in contact with the air layer K. As such, the cross-sectional area of the sectioning member 140 at a first portion 124 is zero (0), which is smaller than the cross-sectional area of the sectioning member 140 at a second portion 125. However, a sectioning member 140 may be disposed at a first portion 124 as long as the cross-sectional area of the sectioning member 140 at the first portion 124 is smaller than the cross-sectional area of the sectioning member 140 at a second portion 125. An antireflection film may be applied to cover the surfaces of the groove 122 of the light guide member 120 at such a first portion 124 so as not to hinder the transmission of the light from the light source 130. For the antireflection film, for example, silicone can be used.

As described above, the cross-sectional area of a sectioning member 140 disposed in the groove 122 at a first portion 124 is smaller than the cross-sectional area of the sectioning member 140 disposed in the groove 122 at a second portion 125. Accordingly, the transmittance of a first portion 124 is higher than the transmittance of a second portion 125. "The transmittance of a first portion 124" is the percentage of the light LA advancing towards the furthest position P1 from the center C that passes through the first portion 124 in the direction orthogonal to the Z direction. Similarly, "the transmittance of a second portion 125" is the percentage of the light LB advancing towards the closest position P2 from the center C that passes through the second portion 125 in the direction orthogonal to the Z direction.

In the case in which sectioning members 140 are disposed at both the first portion 124 and the second portion 125, the concentration of the light reflecting material contained in the sectioning member 140 at the first portion 124 may be set lower than the concentration of the light reflecting material contained in the sectioning member 140 at the second portion 125 in order to make the transmittance of the first portion 124 higher than that of the second portion 125.

A sectioning member 140 may be disposed in each of the first extended portions 123a such that the transmittance at the end portions in the Y direction is higher than the transmittance at the center in the Y direction. The coating amount or the light reflecting material concentration of the sectioning member 140 can be set higher in the center and lower in the end portions in the Y direction. The coating amount or the light reflecting material concentration of the sectioning member 140 may be reduced from the center to the end portions in the Y direction continuously or stepwise. A sectioning member 40 may be disposed in each of the second extended portions 123b in a similar manner.

An light emission region S can be sectioned by forming a groove 122 that surrounds a light source placement part 121 in the light guide member 120 and disposing a sectioning member 140 in the groove 122. However, a first portion 124 furthest from the center C of the light source 130 tends to be less luminous than a second portion 125 closest from the center C because of the longer distance from the light source 130. For this reason, if the groove 122 were uniformly filled with a sectioning member 140, for example, the area near a first portion 124 furthest from the center C would remain less luminous, standing out as a dark portion. If the light sources 130 positioned in the four light emission regions S adjacent to one first portion 124 were lit, in particular, the first portion 124 would stand out as a dark portion even more.

In this embodiment, in contrast, the transmittance of a first portion 124 furthest from the light source 130 is higher than the transmittance of a second portion 125 closest from the light source 130. Allowing a first portion 124 to have a higher transmittance can increase the amount of the light that passes through the first portion 124, thereby increasing the luminance in the area near the first portion 124. This can hinder the area near the first portion 124 from standing out as a dark portion, thereby achieving a planar light source with reduced luminance non-uniformity in light emission regions. In the case of two-dimensionally arranging four adjacent light emission regions S, in particular, this can effectively hinder the first portion 124 from standing out as a dark portion when simultaneously lighting the light sources 130 in the four light emission regions S adjacent to the first portion 124, thereby achieving a planar light source with reduced luminance non-uniformity in light emission regions.

As shown in FIG. 3A, a light reflecting sheet 180 is disposed between the wiring substrate 110 and the light guide member 120. The light reflecting sheet 180 reflects a portion of the light exiting from the light source 130. For the light reflecting sheet 180, a resin sheet containing a large number of voids (e.g., a resin foam sheet), a resin sheet containing a light reflecting material such as titanium oxide, or the like can be used. The light reflecting sheet 180 has a through hole 180a in the position that overlaps each light source placement part 121 in a plan view.

An adhesive sheet 190 is disposed between the wiring substrate 110 and the light reflecting sheet 180. The adhesive sheet 190 is adhered to the wiring substrate 110 and the light reflecting sheet 180. The adhesive sheet 190 has a hole 190a in the position that overlaps each light source placement part 121 in a plan view. An adhesive sheet can additionally be disposed between the light guide member 120 and the light reflecting sheet 180.

On the upper face 110a of the wiring substrate 110 in the region between the light source 130 and the adhesive sheet 190 in the light source placement part 121, a light reflecting member 150, for example, is disposed. This can hinder the wiring substrate 110 from absorbing a portion of the light exiting from the light source 130, thereby reducing the luminance decline around the light source 130.

Instead of disposing a light reflecting member 150, the light reflecting sheet 180 may be extended into the area in the light source placement part 121 of the light guide member 120. This can reduce the luminance decline around the light source(s) 130 as well as reducing the number of members by not disposing a light reflecting member 150. The light reflecting sheet 180 preferably extends to a position to overlap the light source 130 in a plan view, i.e., between the light source 130 and the wiring substrate 110 in a cross-sectional view.

The light reflecting member 150 surrounds a light source 130. The light reflecting member 150 is a resin containing a light reflecting material, for example. Specifically, for the light reflecting member 150, a silicone resin or epoxy resin containing titanium oxide as the light reflecting material can be used.

Each light source placement part 121 is filled with a first light transmissive member 160, for example. The first light transmissive member 160 has light transmissivity with respect to the light exiting from a light source 130. For the material for use as the first light transmissive member 160, for example, a thermosetting resin, such as epoxy, silicone, or the like, can be used. It is particularly preferable to use the same material as that for the light guide member 120 or a material having a lower refractive index than that of the light guide member 120 with respect to the light exiting from a light source 130 for the first light transmissive member 160 so as to allow the light exiting from the light source 130 to readily enter the light guide member 120. The first light transmissive member 160 may contain wavelength conversion particles. Even when the color of the light from a light source 130 measured after mounting the light source 130 and the light guide member 120 on the wiring substrate 110 is deviated from a desired emission color, an adjustment can be made by disposing a first light transmissive member 160 containing wavelength conversion particles so as to achieve the desired emission color. This eliminates the need of replacing light source 130, thereby reducing cost. The light source placement parts 121 may be hollow, i.e., not filled with a first light transmissive member 160.

The upper face of the first light transmissive member 160 is covered by a first light adjusting member 170. In FIG. 3A and FIG. 4A, the first light adjusting member 170 is, for example, in contact with the first light transmissive member 160 and the light guide member 120, but may be in contact only with the first light transmissive member 160.

A first light adjusting member 170 reflects a portion of the light exiting from a light source 130 while transmitting the other portion of the light exiting from the light source 130. The first light adjusting member 170, for example, is a resin containing a light reflecting material. Specifically, for the first light adjusting member 170, a silicone resin or epoxy resin containing titanium oxide as the light reflecting material can be used.

As shown in FIG. 2, the plan view shape of the first light adjusting member 170 is similar to the shape of the light emission region S, i.e., quadrangular. However, the shape of the light adjusting member is not limited to this. For example, the plan view shape of the first light adjusting member 170 does not have to be similar to the shape of the light emission region S. The plan view shape of the first light adjusting member 170 may be another polygon, such as a triangle or hexagon, or may be a circle.

The operation of the planar light source 100 according to this embodiment will be explained next.

Figure 5:
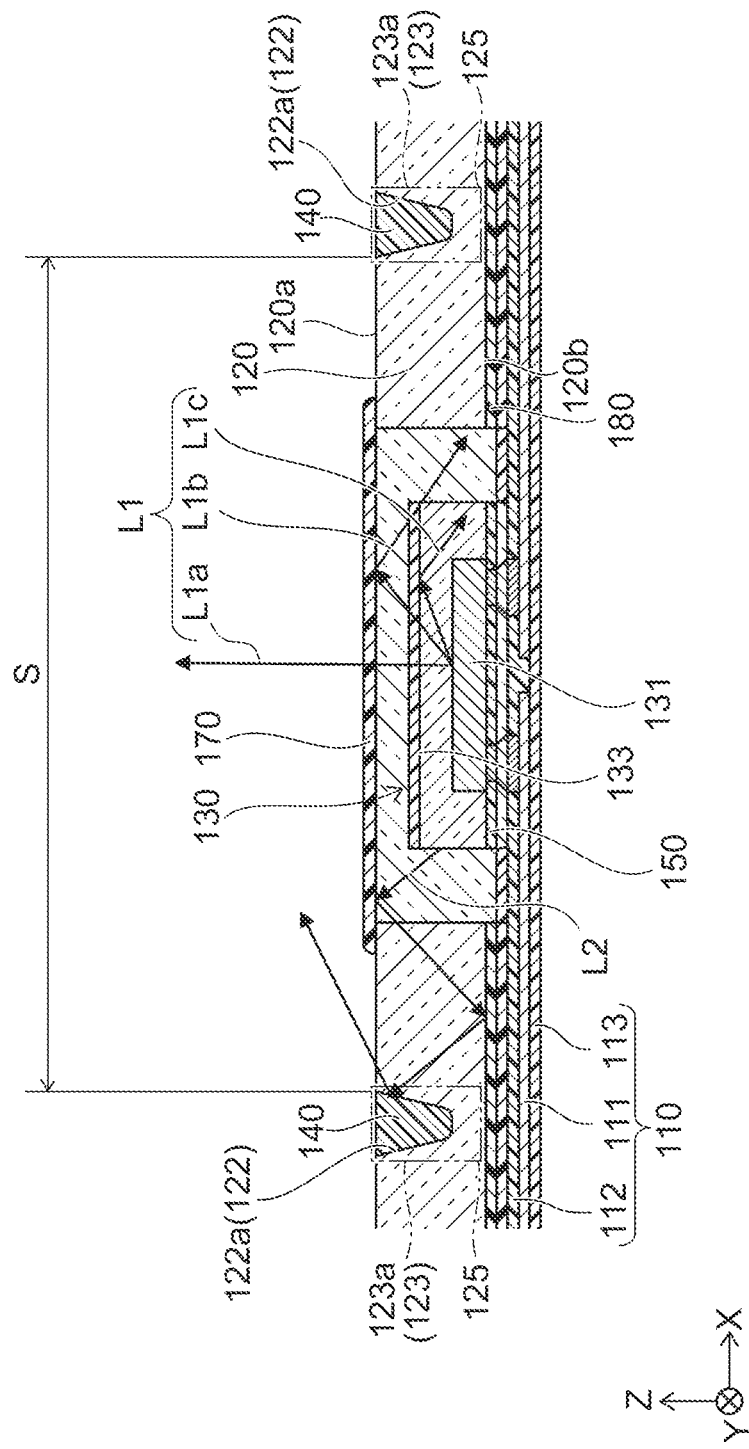
FIG. 5 is a cross-sectional view taken along line 4-4 in FIG. 2 showing an example of the light exiting from the light source.

FIG. 5 is a cross-sectional view taken along line 4-4 in FIG. 2, showing one example of the light exiting from a light source.

Figure 6:
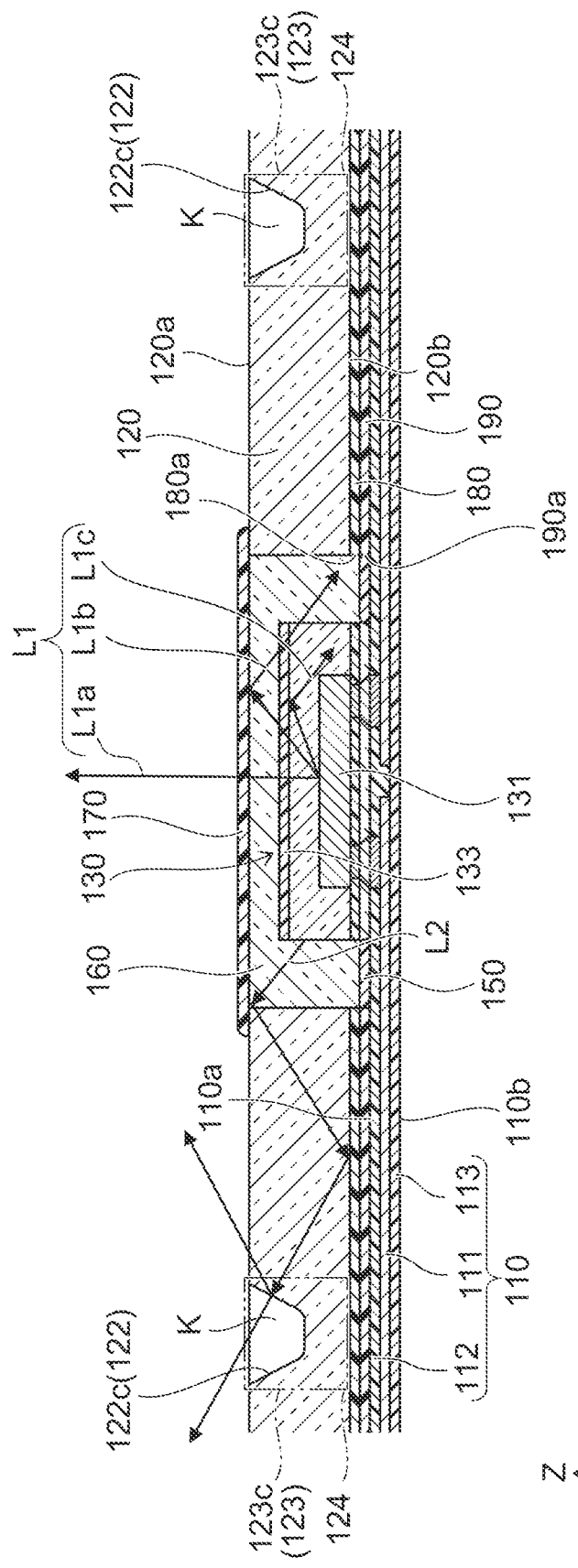
FIG. 6 is a cross-sectional view taken along line 3-3 in FIG. 2 showing an example of the light exiting from the light source.

FIG. 6 is a cross-sectional view taken along line 3-3 in FIG. 2, showing one example of the light exiting from a light source.

As shown in FIG. 5 and FIG. 6, the first light L1a of the light L1 exiting the upper face of the light emitting element 131 passes through the second light adjusting member 133 and the first light adjusting member 170, for example. The second light L1b of the light L1 is reflected by the first light adjusting member 170 after passing through the second light adjusting member 133, and advances towards the lower face 120b of the light guide member 120 or the light reflecting member 150, for example. The third light L1c of the light L1 is reflected by the second light adjusting member 133 and advances towards the lower face 120b of the light guide member 120 or the light reflecting member 150, for example.

As such, the second light adjusting member 133 and the first light adjusting member 170 reflect a portion of the light L1. This can hinder the luminance in the region immediately above a light source 130 from becoming higher than the luminance of the other regions in the irradiated area of the planar light source 100. This, as a result, can reduce the occurrence of luminance non-uniformity.

As shown in FIG. 5, a portion of the second light L1b of the light L1, a portion of the third light L1c of the light L1, and a portion of the light L2 exiting a lateral face of the light emitting element 131 reach a second portion 125 of the section defining part 123 after being reflected by one or more of the members among the light reflecting member 150, the first light adjusting member 170, and the light reflecting sheet 180, for example. Most of the light reaching the second portion 125 is reflected by the sectioning member 140.

As shown in FIG. 6, another portion of the second light L1b of the light L1, another portion of the third light L1c of the light L1, and another portion of the light L2 exiting a lateral face of the light emitting element 131 reach a first portion 124 of the section defining part 123 after being reflected by one or more of the members among the light reflecting member 150, the first light adjusting member 170, and the light reflecting sheet 180, for example. The transmittance at a first portion 124 of the section defining part 123 is higher than the transmittance at a second portion 125 of the section defining part 123. Thus, the amount of the light transmitting through a first portion 124 is greater than the amount of light transmitting through a second portion 125. This can hinder the area near the first portion 124 from standing out as a dark portion.

The planar light source 100 can be applied as a backlight of a liquid crystal display, for example. The backlight in which light emission regions S are sectioned per light source 130 can perform high precision local dimming by individually adjusting the outputs of the light sources 130.

The effect of this embodiment will be explained next.

A planar light source 100 according to this embodiment includes a light source 130, a light guide member 120, and a sectioning member 140. The light guide member 120 has a light source placement part 121 in which a light source 130 is disposed, and a section defining part 123 which includes a groove 122 that surrounds the light source placement part 121. The sectioning member 140 is disposed in the section defining part 123. The transmittance of a first portion 124 in the section defining part 123 that is furthest from the center C of the light source 130 in a plan view is higher than the transmittance of a second portion 125 in the section defining part 123 that is closest from the center C of the light source 130. This can hinder the area near a first portion 124 from standing out as a dark portion. This, as a result, can achieve a planar light source 100 capable of hindering any region of the section defining part 123 furthest from the light source from standing out as a dark portion and having reduced luminance non-uniformity in light emission regions.

Furthermore, the cross-sectional area of the sectioning member 140 disposed in the groove 122 at a first portion 124 is smaller than the cross-sectional area of the sectioning member 140 disposed in the groove 122 at a second portion 125. This can make the transmittance of the first portion 124 higher than the transmittance of the second portion 125.

Moreover, no sectioning member 140 is disposed in any first portion 124. In other words, the first portion 124 is composed only of the light guide member 120. This can hinder the area near the first portion 124 from standing out as a dark portion.

The section defining part 123 has first extended portions 123a extending in a first direction (Y direction), second extended portions 123b extending in a second direction (X direction), and connecting portions 123c connecting the first extended portions 123a and the second extended portions 123b. A first portion 124 is located in a connecting portion 123c. A second portion 125 is located in a first extended portion 123a. This can hinder the area near a connecting portion 123c from standing out as a dark portion.

The sectioning members 140 are disposed in the first extended portions 123a and the second extended portions 123b, but not in the connecting portions 123c. This can increase the luminance of the areas near the connecting portions 123c, hindering them from standing out as dark portions over a large area.

In this embodiment, the area near the connecting portion 123c located at the upper right corner among the four connecting portions 123c in the section defining part 123 was indicated in FIG. 2 (in the +X and +Y directions from the light source 130) as the portion that is hindered from standing out as a dark portion, but the areas near all four connecting portions 123c can be hindered from standing out as dark portions if all four connecting portions 123c in the section defining part 123 are furthest from the light source. The same is true for the embodiments described below.

First Variation of First Embodiment

A first variation of the first embodiment will be explained next.

Figure 7:
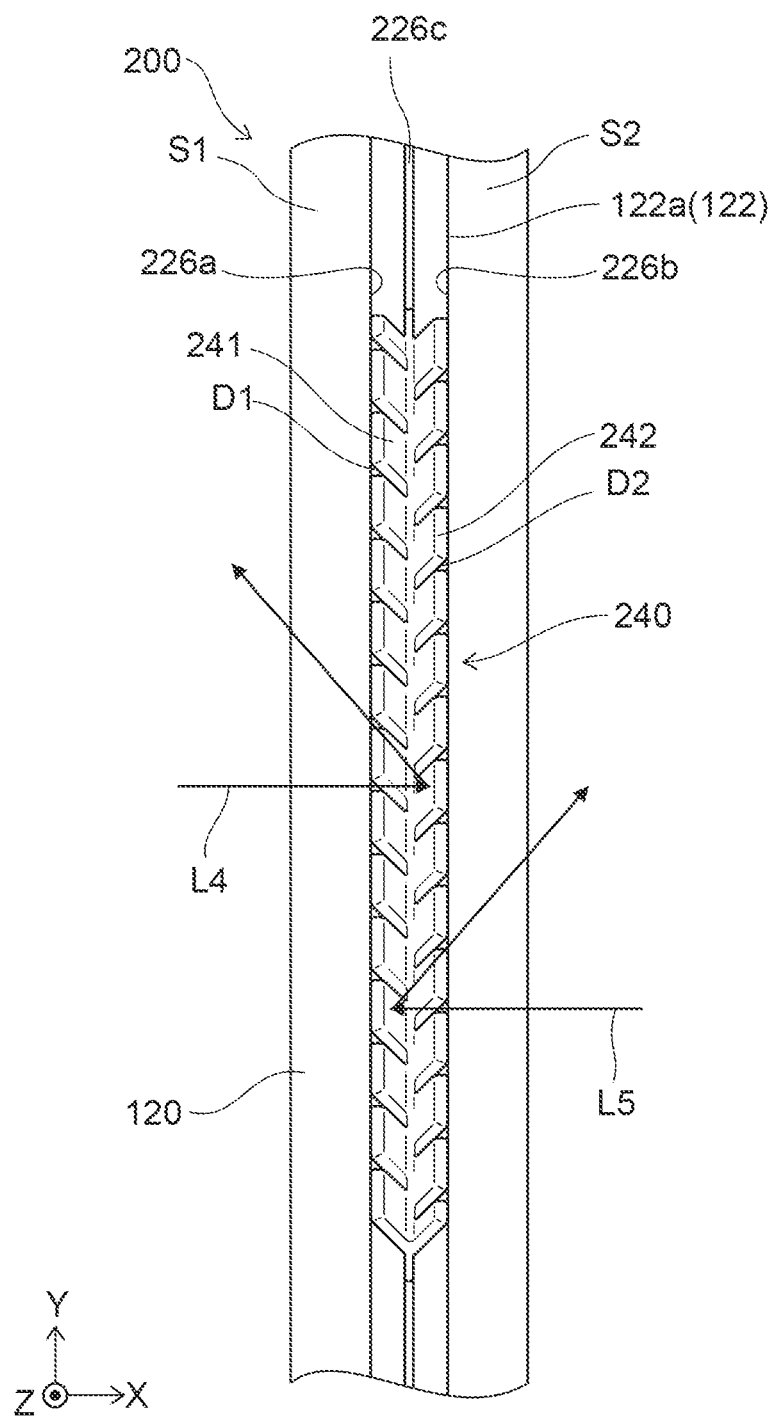
FIG. 7 is a plan view of a planar light source according to a first variation of the first embodiment.

FIG. 7 is a plan view of a planar light source of this variation.

The planar light source 200 of this variation differs from the planar source 100 of the first embodiment in terms of the structures of the sectioning members 240. In the description below, only the differences from the first embodiment will be basically explained. The features other than those described below are similar to those in the first embodiment.

As shown in FIG. 7, a first groove part 122a has a first lateral face 226a and a second lateral face 226b that face each other, and a bottom face 226c positioned between the first lateral face 226a and the second lateral face 226b. A sectioning member 240 is disposed in the first groove part 122a. The sectioning member 240, for example, is a resin containing a light reflecting material.

The sectioning member 240 has on the first lateral face 226a first light reflecting parts 241 arranged by providing a plurality of first gaps D1, and on the second lateral face 226b second light reflecting parts 242 arranged by providing a plurality of second gaps D2. The first gaps D1 face the second light reflecting parts 242. The second gaps D2 face the first light reflecting parts 241. A second groove part 122b may similarly have a sectioning member 240 that has first light reflecting parts 241 and second light reflecting parts 242. The sectioning member 240 may be disposed on the bottom face 226c to integrate the first light reflecting parts 241 and the second light reflecting parts 242 as shown in FIG. 7. The first light reflecting parts 241 may be separated into pieces via the first gaps D1 by not disposing the sectioning member 240 on the bottom face 226c. Similarly, the second reflecting part 242 may be separated into pieces via the second gaps D2.

The length of a first gap D1 in the Y direction may be smaller than the length of a second light reflecting part 242 in the Y direction as shown in FIG. 7, or the same as the length of the second light reflecting part 242 in the Y direction. Similarly, the length of a second gap D2 in the Y direction may be smaller than the length of a first light reflecting part 241 in the Y direction as shown in FIG. 7 or the same as the length of the first light reflecting part 241 in the Y direction.

The operation of the planar light source 200 according to this variation will be explained next. An example in which the planar light source 200 has a first light emission region S1 and a second light emission region S2 adjacent to the first light emission region S1 in the X direction will be explained.

First, the action and the effect of lighting either one of the light source 130 positioned in the first light emission region S1 and the light source 130 positioned in the second light emission region S2 will be explained. Here, the case in which the light source 130 positioned in the first light emission region S1 is lit will be explained.

A portion of the light L4 exiting from the light source 130 positioned in the first light emission region S1 advances through the light guide member 120, and passes through the first gaps D1, for example. The light L4 that passed through the first gaps D1 is reflected by the second light reflecting part 242. This allows the light L4 exiting from the light source 130 to pass through the groove 122 while hindering it from entering the second light emission region S2. Accordingly, the luminance in the groove 122 can be increased, while using the lateral face 226b of the groove 122 to section the light emission regions. This can increase the luminance in the periphery of the first light emission region S1.

Next, the action and the effect of simultaneously lighting the light source 130 positioned in the first light emission region S1 and the light source 130 positioned in the second light emission region S2 will be explained.

A portion of the light L4 exiting from the light source 130 positioned in the first light emission region S1 advances through the light guide member 120, and passes through the first gaps D1, for example. The light L4 that passed through the first gaps D1 is reflected by the second light reflecting parts 242.

Similarly, a portion of the light exiting L5 from the light source 130 positioned in the second light emission region S2 advances through the light guide member 120, and passes through the second gaps D2, for example. The light L5 that passed through the second gaps D2 is reflected by the first light reflecting parts 241.

When simultaneously lighting the light source 130 positioned in the first light emission region S1 and the light source 130 positioned in the second light emission region S2, it is required to achieve an light emission region which integrates the first light emission region S1 and the second light emission region S2 by increasing the luminance of the region between the first light emission region S1 and the second light emission region S2, i.e., the groove 122 (by hindering the groove 122 from standing out as a dark portion). This embodiment can increase the luminance in the groove 122 positioned between the first light emission region S1 and the second light emission region S2 (can hinder the groove 122 from standing out as a dark portion), thereby achieving a light emission region that integrates the first light emission region S1 and the second light emission region S2.

As described above, the planar light source 200 of this variation of the first embodiment allows the groove 122 to section the light emission regions S such that when only the light source 130 positioned in one of the two adjacent light emission regions S is lit, the light exiting the light emission region S does not enter the adjacent light emission region S. Furthermore, when the light sources 130 in the multiple light emission regions S are simultaneously lit, the luminance in the groove 122 positioned between the light emission regions S can be increased so as not to become a dark portion.

The dimensions of the individual first gaps D1 in the Y direction do not have to be the same. Similarly, the dimensions of the individual second gaps D2 in the Y direction do not have to be the same. For example, the size of the individual first gaps D1 can become larger towards the ends of the first groove part 122a in the Y direction. Similarly, the size of the individual second gaps D2 can become larger towards the ends of the first groove part 122a in the Y direction. This can increase the luminance in the regions of the groove 122 that tend to become dark portions (the end portions of the first groove part 122a in the Y direction).

The effect of this variation will be explained next.

In this variation, the groove 122 of a section defining part 123 has a first lateral face 226a and a second lateral face 226b that face each other. The sectioning member 240 in the groove has on the first lateral face 226a a plurality of first light reflecting parts 241 arranged by interposing a first gap D1, and on the second lateral face 226b a plurality of second light reflecting parts 242 arranged by interposing a second gap D2. The first gaps D1 face corresponding ones of the second light reflecting parts 242. The second gaps D2 face corresponding one of the first light reflecting parts 241. This can increase the luminance of the groove 122 positioned between two light emission regions S so as not to become a dark portion when the light sources 130 in the light emission regions S are simultaneously lit. When the light source 130 in only one of two adjacent light emission regions S is lit, the groove 122 can section the light emission regions such that the light does not enter the adjacent light emission region S.

Second Variation of First Embodiment

A second variation of the first embodiment will be explained next.

Figure 8:
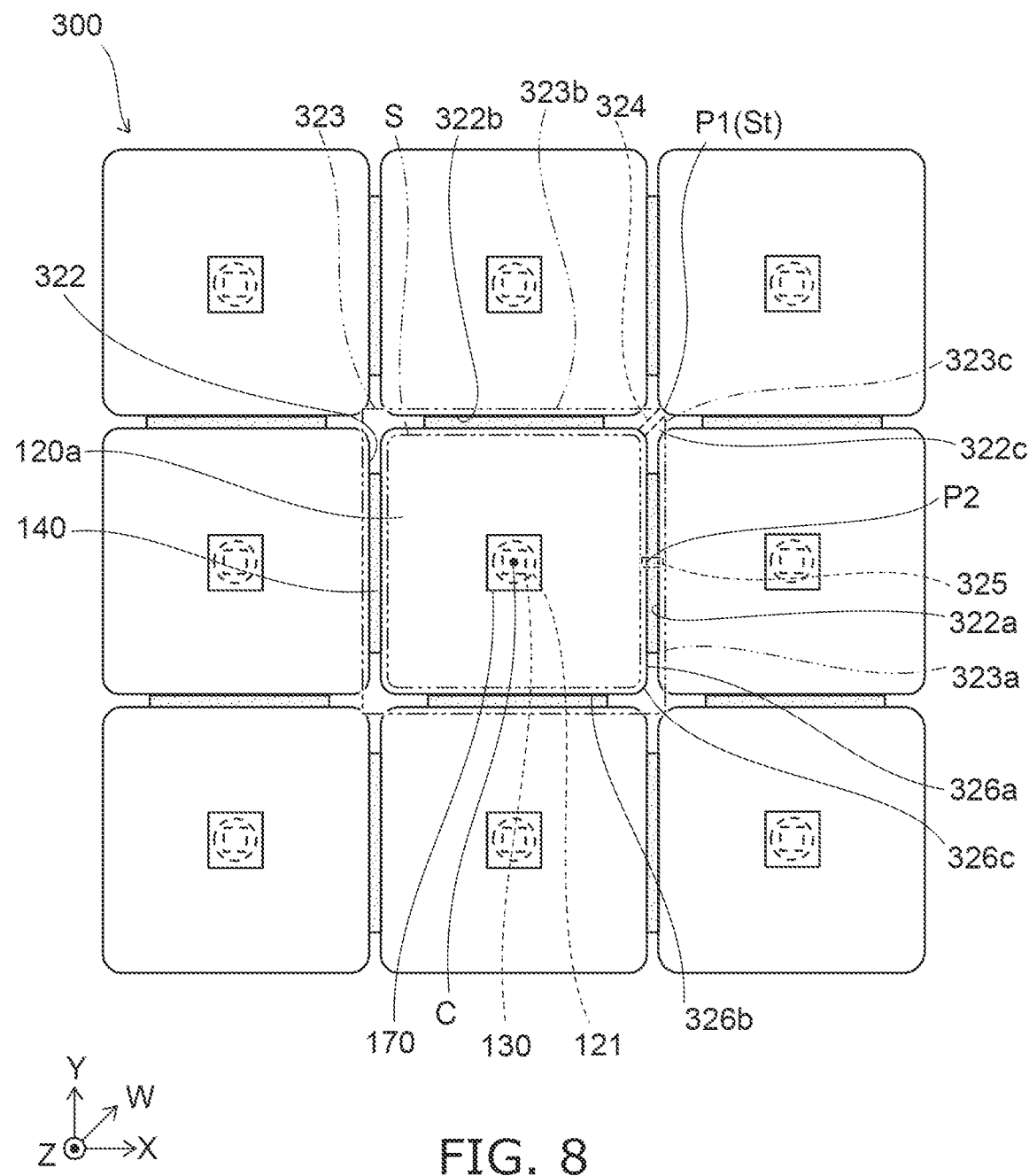
FIG. 8 is a plan view of a planar light source according to a second variation of the first embodiment.

FIG. 8 is a plan view of a planar light source of this variation.

The planar light source 300 of this variation differs from the planar light source 100 of the first embodiment in terms of the structure of the groove 322.

In the upper face 120a of the light guide member 120, a groove 322 is provided to surround the light source placement parts 121. The groove 322 around one light source 130 has, for example, two first groove parts 322a extending in the Y direction, two second groove parts 322b extending in the X direction, and four connecting groove parts 322c connecting the first groove parts 322a and the second groove parts 322b.

The groove lateral face 326c in a connecting portion 323c that connects the groove lateral face 236a in a first extended portion 323a and the groove lateral face 326b in a second extended portion 323b is curved in a plan view. The lateral face 326a of the first groove part 322a and the lateral face 326b of the second groove part 322b are connected by the lateral face 326c of the connecting groove part 322c, and the lateral face 326c of the connecting groove part 322c is a curved face protruding away from the light source 130. Accordingly, the plan view shape of each light emission region S is substantially quadrangular with rounded corners. In this variation, the connecting groove parts 322c are connected to the corresponding first groove parts 322a and the corresponding second groove parts 322b, extending in both the X and Y directions (L-shaped in one section defining part 323 as shown in FIG. 8, and cross-shaped in the arrangement of multiple section defining parts 323).

Because the lateral faces 326c of the connecting groove parts 322c are curved, the light passing through the lateral faces 326c of the connecting groove parts 322c is diffracted and collected. This can increase the luminance in the areas near the connecting groove parts 322c, thereby hindering the areas near the connecting groove parts 322c from standing out as dark portions.

The section defining part 323 is configured of a groove 322 and the portion of the light guide member 120 positioned directly under the groove 322. Specifically, the section defining part 323 has first extended portions 323a, second extended portions 323b, and connecting portions 323c. The first extended portions 323a are configured of the corresponding first groove parts 322a and the portion in the light guide member 120 directly under the corresponding first groove part 322a. The second extended portions 323b are configured of the corresponding second groove parts 322b and the portions in the light guide member 120 directly under the corresponding second groove parts 322b. The connecting portions 323c are configured of the corresponding connecting groove parts 322c and the portion in the light guide member 120 directly under the corresponding connecting groove parts 322c.

Furthermore, the section defining part 323 has a first portion 324 furthest from the center C and a second portion 325 closest from the center C.

In the section defining part 323, a furthest position P1 from the center C is located at the vertex St on the corner of another light emission region S of the planar light source 300 that is adjacent in a diagonal direction W. Thus, a first portion 324 is a portion that includes a furthest position P1 of the section defining part 323 and has a thickness in the direction orthogonal to the diagonal direction W and the Z direction.

In the section defining part 323, a closest position P2 from the center C is located on the outline of the light emission region S met by the straight line passing the center C and in parallel to the X direction (or the Y direction). Accordingly, a second portion 325 is a portion that includes a closest position P2 of the section defining part 323 and has a thickness in the Y direction (or the X direction).

Sectioning members 140 are disposed in the portions of the first groove parts 322a excluding both of the end portions in the Y direction, and in the portions of the second groove parts 322b excluding both of the end portions in the X direction. No sectioning member 140 is disposed in the connecting groove parts 322c. Accordingly, the transmittance of a first portion 324 is higher than the transmittance of a second portion 325.

The effect of this variation will be explained next.

Similar to the first embodiment, the transmittance of a first portion 324 is higher than the transmittance of a second portion 325 in this variation. This can hinder the areas near the first portions in the irradiated ranges of the light from the planar light source 300 from standing out as dark portions.

Furthermore, the lateral faces 326c of the connecting groove parts 322c that connect the lateral faces 326a of the groove 322 in the first extended portions 323a and the lateral faces 326b of the groove 322 in the second extended portions 323b are curved. Thus, the light exiting the lateral faces 326c is collected. This can more effectively hinder the areas near the connecting portions 323c from standing out as dark portions.

Second Embodiment

A second embodiment will be explained next.

Figure 9:
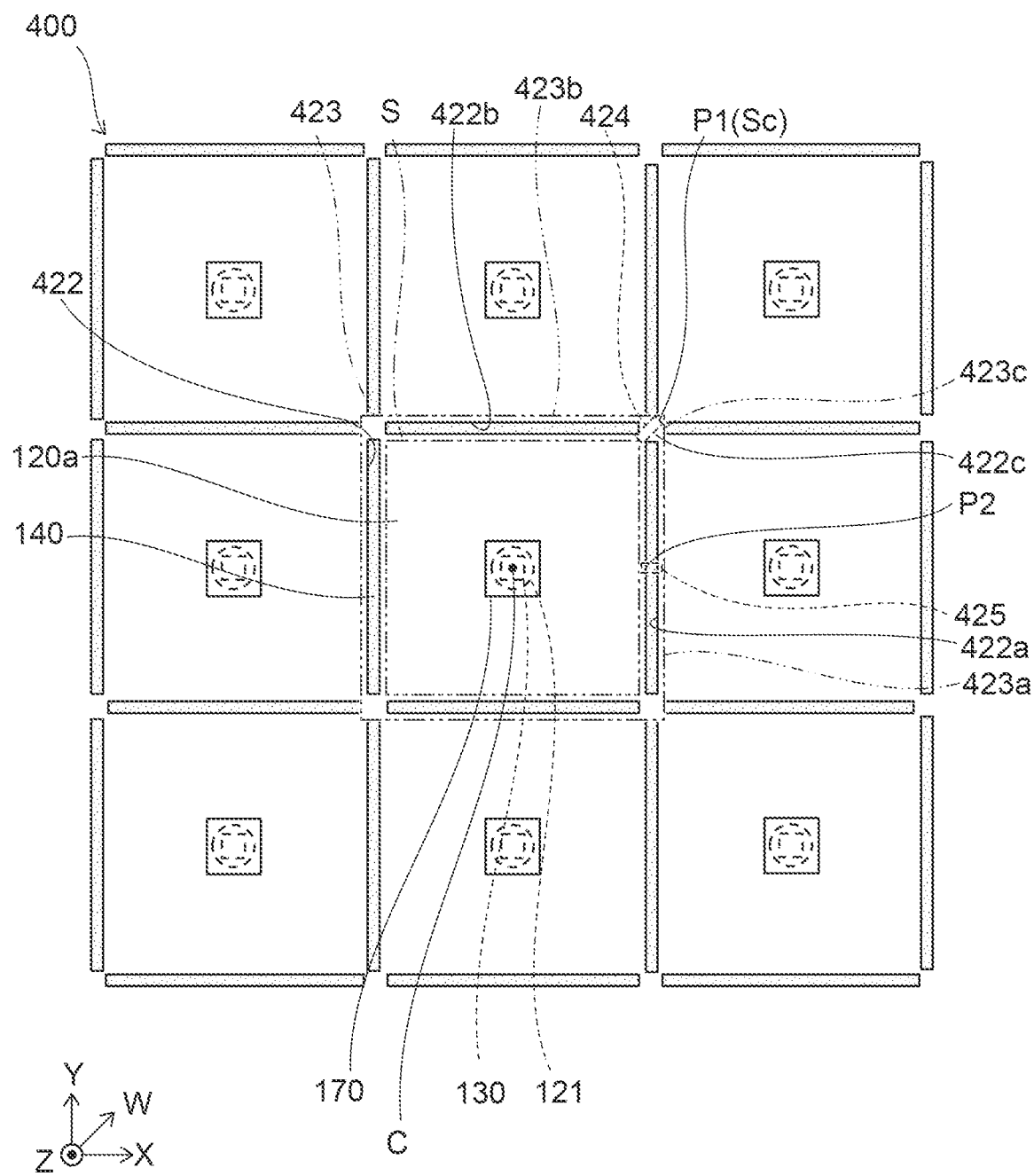
FIG. 9 is a plan view of a planar light source according to a second embodiment.

FIG. 9 is a plan view of a planar light source of this embodiment.

The planar light source 400 of this embodiment differs from the planar light source 100 of the first embodiment in terms of the structures of the grooves 422.

In the upper face 120a of the light guide member 120, grooves 422 that discontinuously surround the light source placement parts 121 are provided. Around a light source placement part 121, the grooves 422 have, for example, two first groove parts 422a extending in the Y direction and two second groove parts 422b extending in the X direction. No groove is provided at the end portions of the first groove parts 422a in the Y direction and the end portions of the second groove parts 422b in the X direction. In other words, in this embodiment, there is no connecting groove part 122c in the light guide member 120.

The grooves 422 section the upper face 120a of the light guide member 120 into multiple light emission regions S. The light emission region S is a region of the upper face 120a surrounded by two first groove parts 422a, two second groove parts 422b, and extended parts 422c at which the virtual extensions in the Y direction of the ends of the first groove parts 422a in the Y direction intersect the virtual extensions in the X direction of the ends of the second groove parts 422b in the X direction.

Section defining parts 423 are configured of the corresponding grooves 422, the portions of the light guide member 120 positioned directly under the corresponding grooves 422, and the portions of the light guide member 120 that overlap the extended parts 422c. The section defining part 423 has a first portion 424 furthest from the center C and a second portion 425 closest from the center C.

In the section defining part 423, a furthest position P1 from the center C is located at the corner Sc of another light emission region S of the planar light source 400 that is adjacent in a diagonal direction. Accordingly, a first portion 424 is a portion that includes a furthest position P1 of the section defining part 423 and has a thickness in the direction orthogonal to the diagonal direction W and the Z direction.

In the section defining part 423, a closest position P2 from the center C is located on the outline of the light emission region S met by the straight line passing the center C and in parallel to the X direction (or the Y direction) in a plan view. Accordingly, a second portion 425 is a portion that includes a second position P2 of the section defining part 423 and has a thickness in the Y direction (or the X direction).

The sectioning members 140 fill, for example, the first groove parts 422a and the second groove parts 422b. No groove 422 or sectioning member 140 is provided in the connecting portions 423c. Accordingly, the transmittance of a first portion 424 is higher than the transmittance of a second portion 425.

The effect of this embodiment will be explained next.

In this embodiment, no groove 422 is disposed in the first portions 424. This can hinder the area near the first portions from standing out as dark portions even more effectively.

Third Embodiment

A third embodiment will be explained next.

Figure 10:
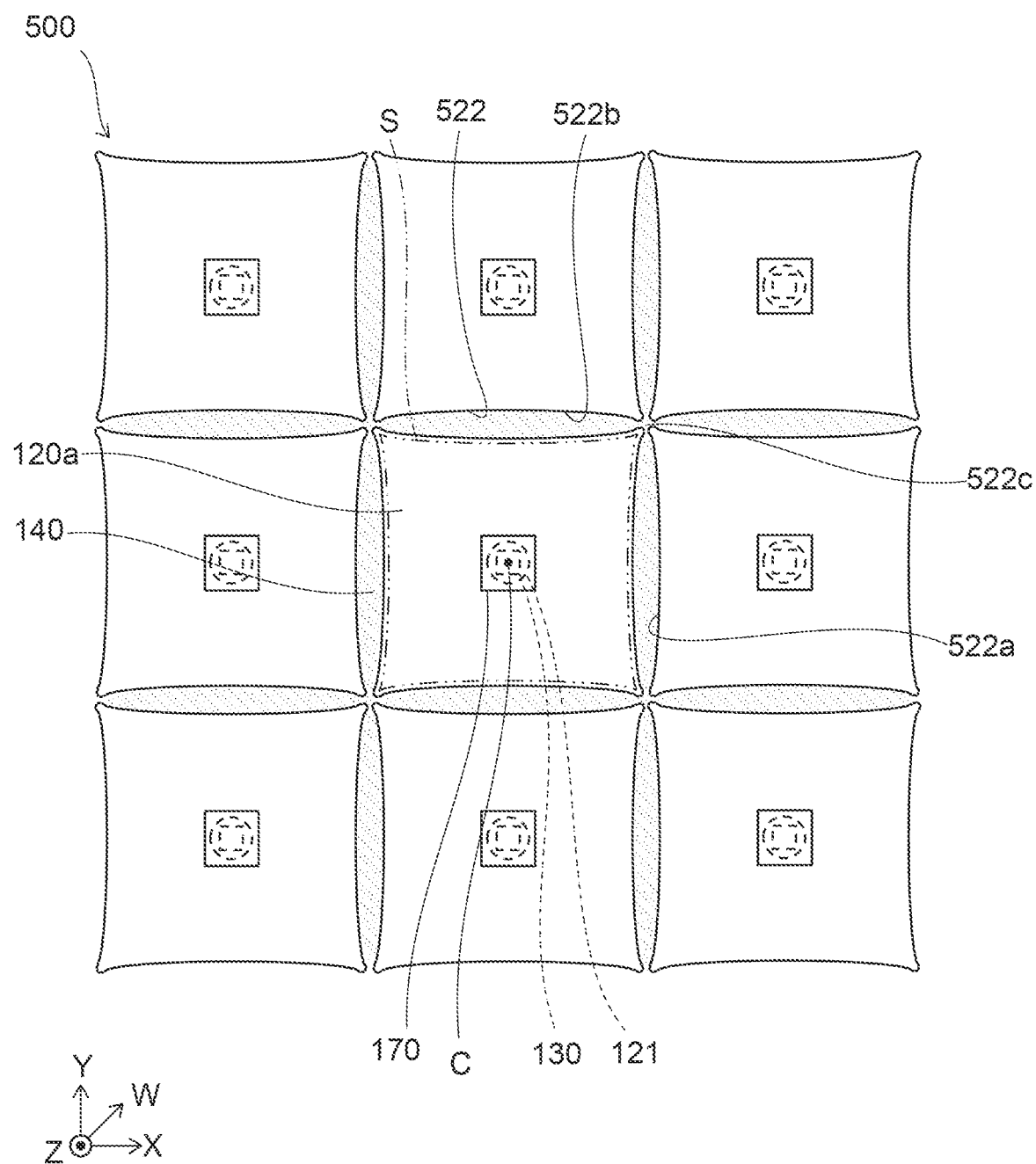
FIG. 10 is a plan view of a planar light source according to a third embodiment.

FIG. 10 is a plan view of a planar light source of this embodiment.

Figure 11:
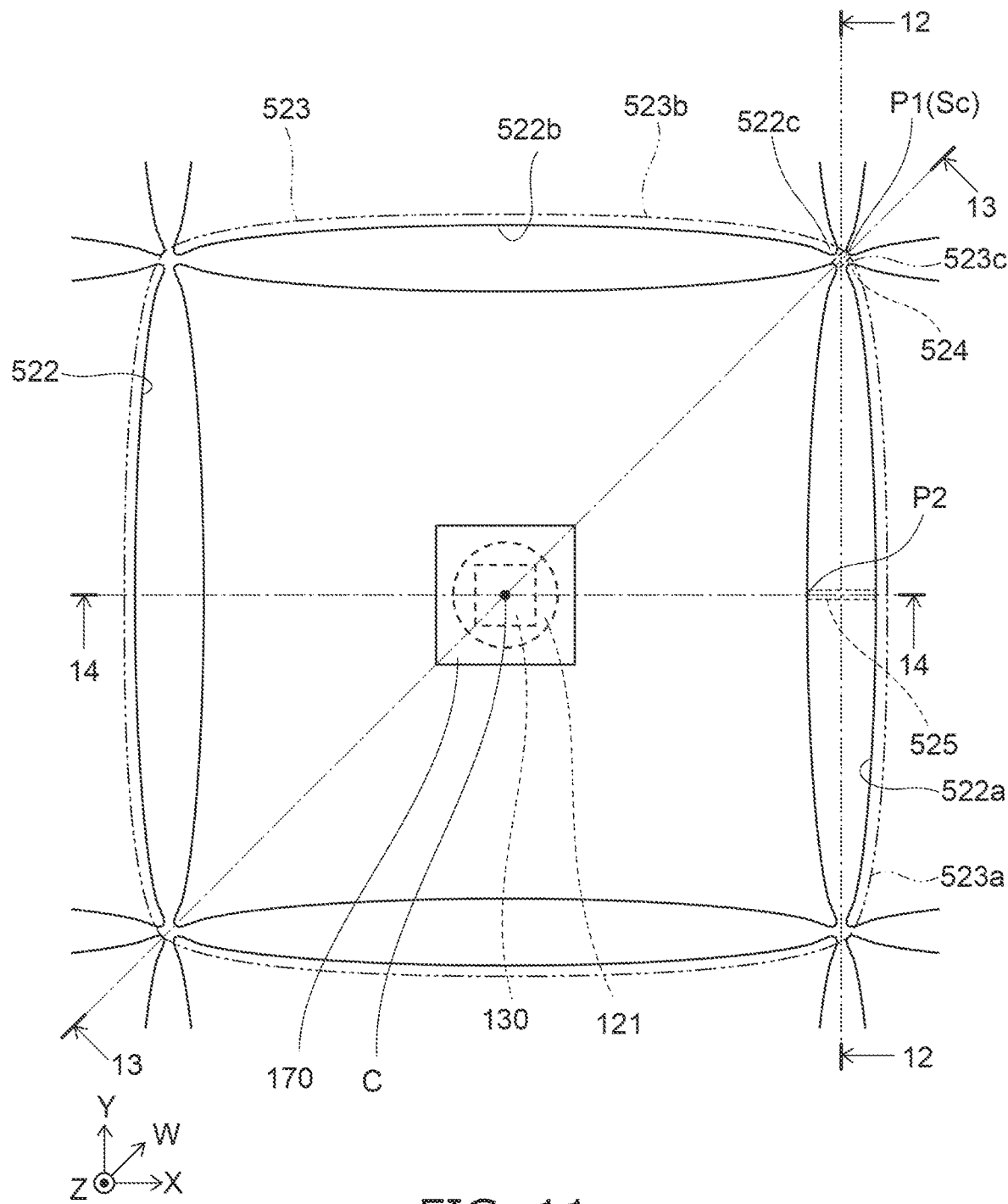
FIG. 11 is a plan view enlarging a portion of FIG. 10.

FIG. 11 is a plan view enlarging a portion of FIG. 10.

Figure 12:
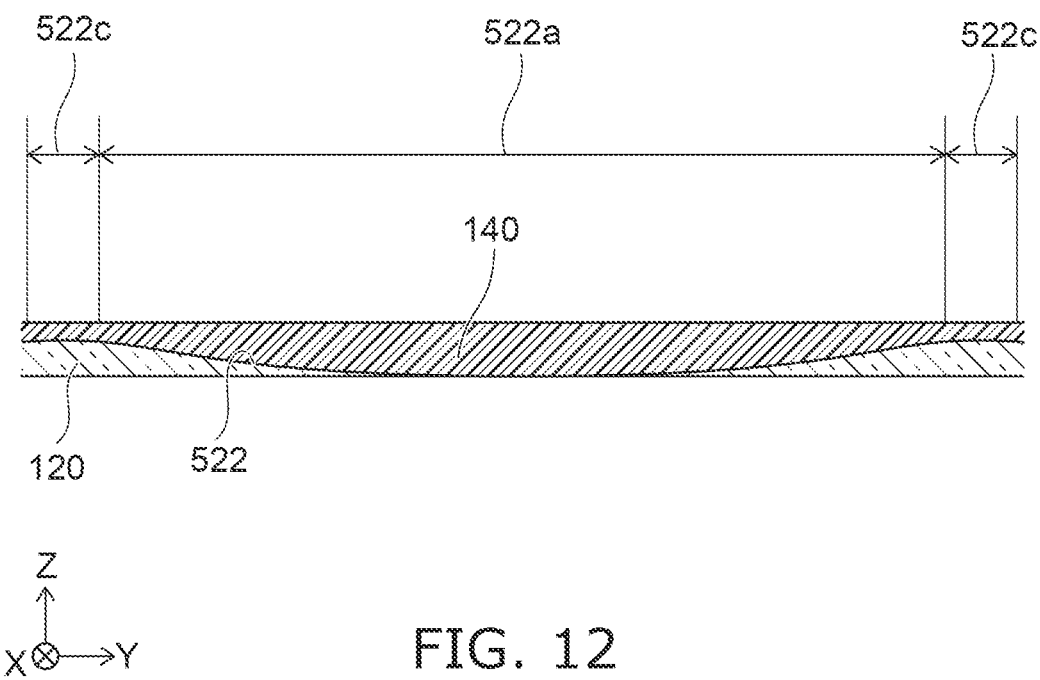
FIG. 12 is a cross-sectional view taken along line 12-12 in FIG. 11.

FIG. 12 is a cross-sectional view taken along line 12-12 in FIG. 11.

Figure 13:
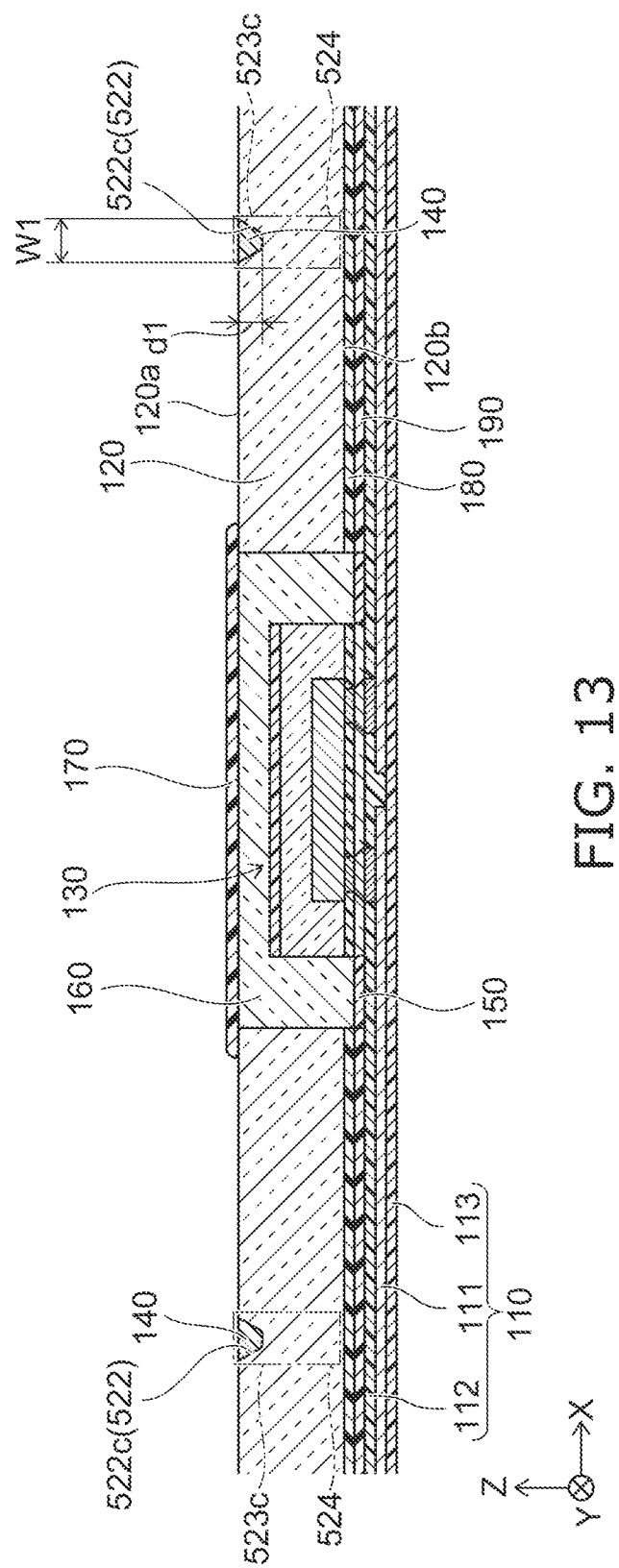
FIG. 13 is a cross-sectional view taken along line 13-13 in FIG. 11.

FIG. 13 is a cross-sectional view taken along line 13-13 in FIG. 11.

Figure 14:
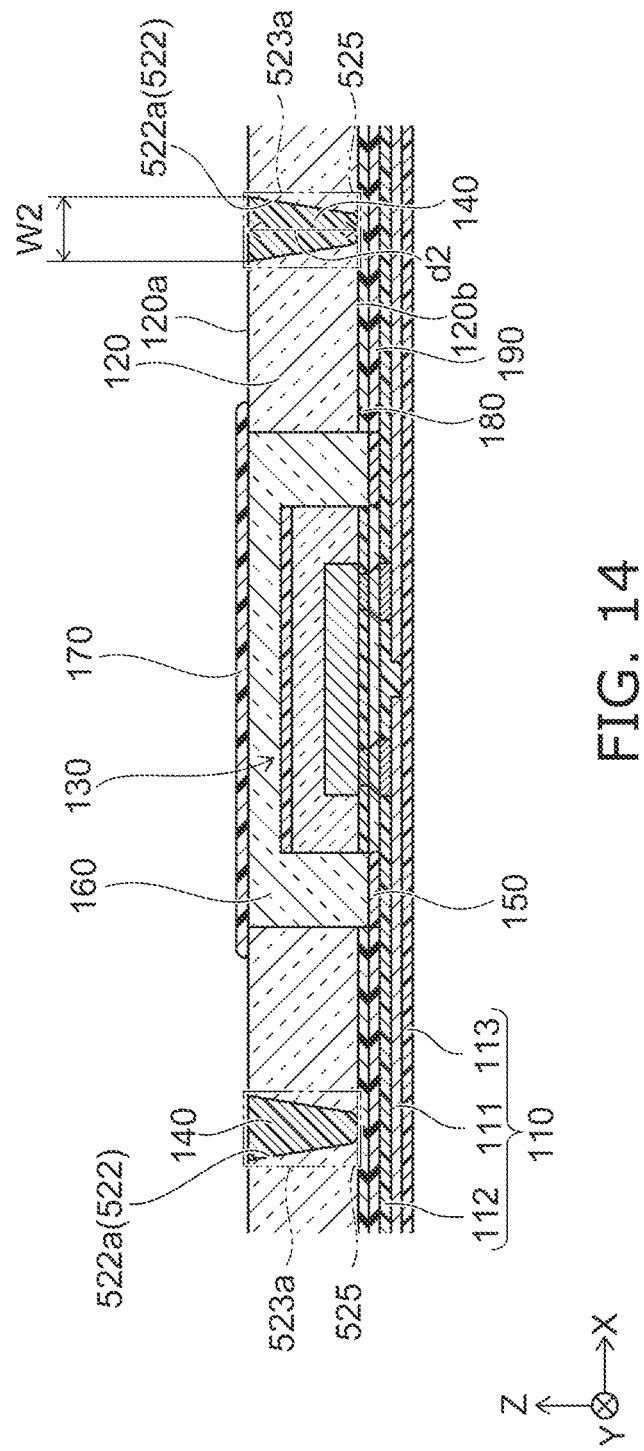
FIG. 14 is a cross-sectional view taken along line 14-14 in FIG. 11.

FIG. 14 is a cross-sectional view taken along line 14-14 in FIG. 11.

The planar light source 500 of this embodiment differs from the planar light source 100 of the first embodiment in terms of the structure of the groove 522.

As shown in FIG. 10, in the upper face 120a of the light guide member 120, a groove 522 that continuously surrounds the individual light source placement parts 121 is provided. The groove 522 has, around one light source placement part 121, two first groove parts 522a extending in the Y direction, two second groove parts 522b extending in the X direction, and four connecting groove parts 522c connecting the first groove parts 522a and the second groove parts 522b, for example.

As shown in FIG. 11, the width of a first groove part 522a (dimension in the X direction) is largest at the position in the Y direction that coincides with the closest position P2 from the light source 130, and smallest at both ends in the Y direction. Similarly, the width of a second groove part 522b (dimension in the Y direction) is largest at the position in the X direction that coincides with the closest position from the light source 130, and smallest at both ends in the X direction.

As shown in FIG. 12, the depth of the groove 522 (dimension in the Z direction) is largest in a first groove part 522a or second groove part 522b, for example. More specifically, the depth of the groove 522 is largest at the central position of a first groove part 522a in the Y direction or the central position of a second groove part 522b in the X direction. The depth of the groove 522, for example, is smallest in a connecting groove part 522c. More specifically, the depth of the groove 522 is smallest at the central position of a connecting groove part 522c in the X or Y direction. As such, the width and the depth of the groove 522 do not have to be constant. The width and the depth of the groove 522 can be changed by adjusting the depth of insertion of a tapered cutter, such as a dicing saw, into the light guide member 120.

In the case in which the depth of the groove 522 varies depending on the position in the X or Y direction, the wiring layer 111 in the wiring substrate 110 may be disposed so as to avoid the areas directly under the portions of the groove 522 having the largest depth. When configured in this manner, the occurrence of damaging the wiring layer 111 can be reduced during the process of forming the groove 522 using a cutting tool such as a dicing saw.

As shown in FIG. 11, the section defining part 523 is configured of a groove 522 and the portion of the light guide member 120 positioned directly under the groove 522. The section defining part 523 has first extended portions 523a, second extended portions 523b, and connecting portions 523c. The first extended portions 523a are configured of the corresponding first groove parts 522a and the portions of the light guide member 120 directly under the first groove parts 522a. The second extended portions 523b are configured of the corresponding second groove parts 522b and the portions of the light guide member 120 directly under the corresponding second groove parts 522b. The connecting portions 523c are configured of the corresponding connecting groove parts 522c and the portions of the light guide member 120 directly under the corresponding connecting groove parts 522c.

Furthermore, the section defining part 523 has a first portion 524 furthest from the center C, and a second portion 525 closest from the center C.

A furthest position P1 of the section defining part 523 from the center C is located at the corner Sc of another light emission region S of the planar light source 500 that is adjacent in a diagonal direction W. Accordingly, a first portion 124 is a portion that includes a furthest position P1 of the section defining part 523 and has a thickness in the direction orthogonal to the diagonal direction W and the Z direction.

A closest position P2 of the section defining part 523 closest from the center C is positioned on the outline of the light emission region S met by the straight line passing the center C and in parallel to the X direction (or the Y direction) in a plan view. Accordingly, a second portion 525 is a portion that includes a closest position P2 of the section defining part 523 and has a thickness in the Y direction or the X direction.

As shown in FIG. 13 and FIG. 14, the depth of the groove 522 in the cross section of a first portion 524 is smaller than the depth of the groove 522 in the cross section of a second portion 525. "The depth of the groove 522 in the cross section of a first portion 524" refers to the maximum value of the depth d1 of the groove 522 in the cross section of a first portion 524 shown in FIG. 13. "The depth of the groove 522 in the cross section of a second portion 525" refers to the maximum value of the depth d2 of the groove 522 in the cross section of a second portion 525 in FIG. 14. "The cross section of a first portion 524" means the cross section that includes a furthest position P1 furthest from the center C of the light source 130 (the cross section taken along line 13-13 in FIG. 11). "The cross section of a second portion 525" means the cross section that includes a closest position P2 closest from the center C of the light source 130 (the cross section taken along line 14-14 in FIG. 11).

Furthermore, as shown in FIG. 13 and FIG. 14, the distance W1 between the facing lateral faces of the groove 522 at a first portion 524 is smaller than the distance W2 between the facing lateral faces of the groove 522 at a second portion 525. "The distance W1 between the facing lateral faces of the groove 522 at a first portion 524," as shown in FIG. 13, is the maximum distance between the facing lateral faces of the groove 522 at a first portion 524. "The distance W2 between the facing lateral faces of the groove 522 at a second portion 525," as shown in FIG. 14, is the maximum distance between the facing lateral faces of the groove 522 at a second portion 525. Distance means the distance in the direction orthogonal to the Z direction.

As such, the cross-sectional area of the groove 522 at a first portion 524 is smaller than the cross-sectional area of the groove 522 at a second portion 525. Accordingly, even when the first groove parts 522a, the second groove parts 522b, and the connecting groove parts 522c are filled with a sectioning member 140, for example, the transmittance of a first portion 524 is higher than the transmittance of a second portion 525. "The cross-sectional area of the groove 522 at a first portion 524" refers to the area of the groove 522 in a cross section that includes a furthest position P1 furthest from the center C and the light source (taken along line 13-13 in FIG. 11). "The cross-sectional area of the groove 522 at a second portion 525" refers to the area of the groove 522 in a cross section that includes a closest position P2 closest from the center C and the light source (taken along line 14-14 in FIG. 11).

The effect of this embodiment will be explained next.

In this embodiment, the depth of the groove 522 in the cross section of a first portion 524 is smaller than the depth of the groove 522 in the cross section of a second portion 525. This can hinder the area near the first portions 524 from standing out as dark portions.

Furthermore, the distance W1 between the facing lateral faces of the groove 522 in the cross section of a first portion 524 is smaller than the distance W2 between the facing lateral faces of the groove 522 in the cross section of a second portion 525. This can hinder the area near the first portion 524 from standing out as dark portions.

The cross-sectional area of the groove 522 at a first portion 524 is smaller than the cross-sectional area of the groove 522 at a second portion 525. This allows a first portion 524 to have a higher transmittance than that of a second portion 525.

In the embodiment described above, both the width and the depth of the groove were varied, but only the width may be varied, or only the depth may be varied.

Fourth Embodiment

A fourth embodiment will be explained next.

Figure 15:
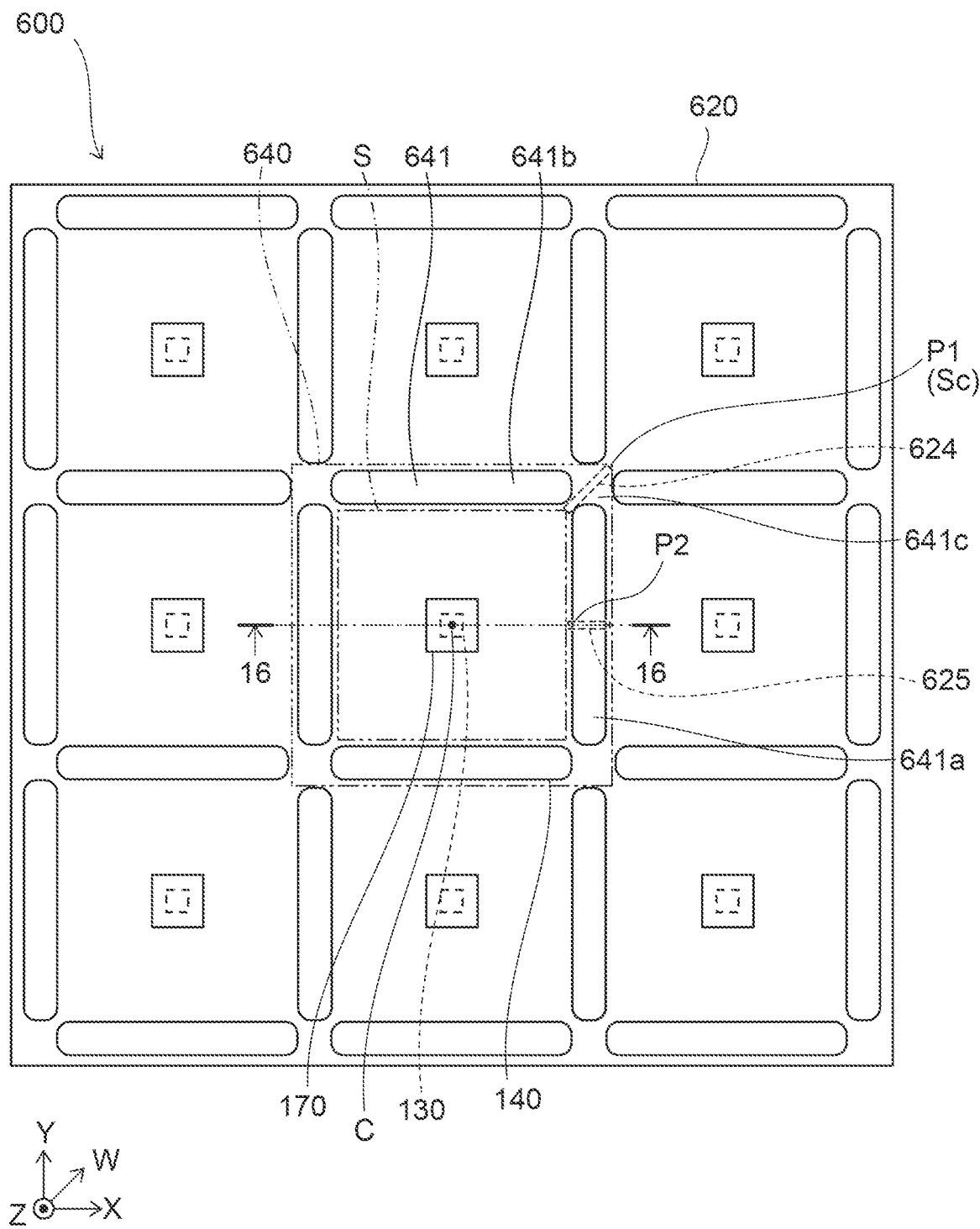
FIG. 15 is a plan view of a planar light source according to a fourth embodiment.

FIG. 15 is a plan view of a planar light source of this embodiment.

Figure 16:
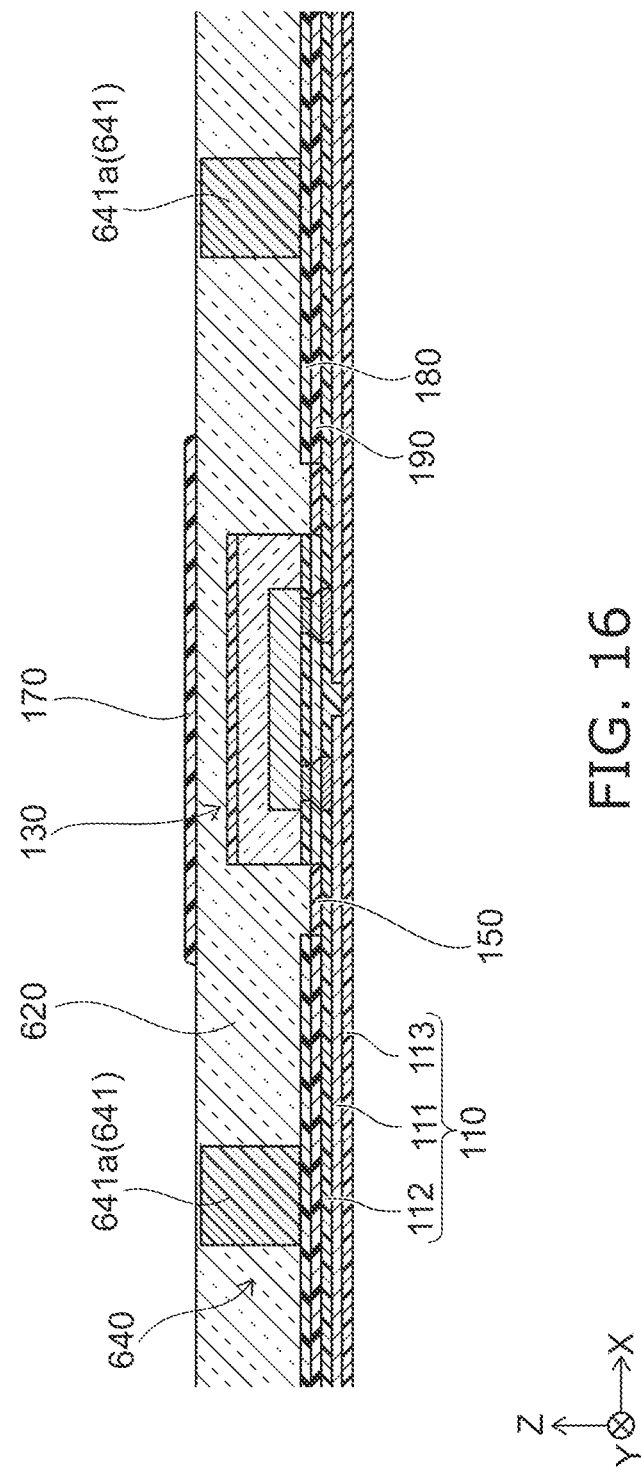
FIG. 16 is a cross-sectional view taken along line 16-16 in FIG. 15.

FIG. 16 is a cross-sectional view taken along line 16-16 in FIG. 15.

The planar light source 600 of this embodiment differs from the planar light source 100 of the first embodiment by not having section defining parts.

As shown in FIG. 15, in the planar light source 600, sectioning members 641 are disposed to discontinuously surround the light sources 130 mounted on the wiring substrate 110. As shown in FIG. 16, the sectioning members 641 are disposed, for example, on and in contact with the light reflecting sheet 180.

As shown in FIG. 15, the sectioning members 641 have two first reflecting parts 641a extending in the Y direction and two second reflecting parts 641b extending in the X direction around one light source 130. The first reflecting parts 641a and the second reflecting parts 641b are spaced apart, and no sectioning member 641 is disposed between the end of the first reflecting parts 641a in the Y direction and the end of the second reflecting parts 641b in the X direction. Hereinbelow, a portion surrounded by two adjacent first reflecting parts 641a in the Y direction and two adjacent second reflecting parts 641b in the X direction in which no sectioning member 641 is disposed will also be referred to as a "gap between the sectioning members 641."

A sectioning member 641 is a resin containing a light reflecting material, for example. Specifically, for the sectioning member 641, a silicone resin or epoxy resin containing titanium oxide as the light reflecting material can be used.

As shown in FIG. 15 and FIG. 16, a light guide member 620 is disposed to cover the light source 130 and the sectioning members 641. The light guide member 620 is provided inside of the peripheral part 640 that includes the sectioning members 641 described later, i.e., the region corresponding to the light emission region S described later, encapsulating the light source 130. The light guide member 620 is also provided in the gaps between the sectioning members 641. The light guide member 620 is provided directly on the sectioning members 641. However, the light guide member 620 does not have to be provided in the gaps between the sectioning members 641 or provided directly on the sectioning members 641.

Hereinbelow, the frame-shaped portion enclosing a light source 130 and including the sectioning members 641 will be referred to as a "peripheral part 640," and the region surrounded by the peripheral part 640 will be referred to as an "light emission region S." In this embodiment, the sectioning members 641 discontinuously surround a light source 130. As such, a peripheral part 640 is configured of first reflecting parts 641a, second reflecting parts 641b, and extended parts 641c at which the virtual extensions in the Y direction of the ends of the first reflecting parts 641a in the Y direction intersect the virtual extensions in the X direction of the ends of the second reflecting parts 641b in the X direction. In this embodiment, the light guide member 620 fills the extended parts 641c.

The peripheral parts 640 have corresponding first portions 624 furthest from the center C and corresponding second portions 625 closest from the center C.

In a peripheral part 640, a furthest position P1 furthest from the center C is located at the corner Sc of an extended part 641c. Accordingly, a first portion 624 is a portion that includes a furthest position P1 of the peripheral part 640 and has a thickness in the direction orthogonal to the diagonal direction W and the Z direction.

In the peripheral part 640, a closest position P2 closest from the center C is located on the face of a first reflecting part 641a (or a second reflecting part 641b) that is in contact with the light guide member 620 and met by the straight line passing the center C and in parallel to the X direction (or the Y direction) in a plan view. Accordingly, a second portion 625 is a portion that includes a closest position P2 of the peripheral part 640 and has a thickness in the Y direction (or the X direction).

No sectioning member 641 is disposed in the first portions 624, but a sectioning member 641 is disposed at the second portions 625. Accordingly, the transmittance of a first portion 424 is higher than the transmittance of a second portion 625.

The effect of this embodiment will be explained next.

The planar light source 600 according to this embodiment includes a light source 130 and a peripheral part 640 that surrounds the light source 130 and includes sectioning members 641. The light source is covered by the light guide member 620. The transmittance of a first portion 624 in the peripheral part 640 that is furthest from the center C of the light source 130 in a plan view is higher than the transmittance of a second portion 625 in the peripheral part 640 that is closest from the center C of the light source 130. This can hinder the areas near the first portions 624 in the irradiated area(s) of the light from the planar light source 600 from standing out as dark portions. As a result, a planar light source 600 capable of hindering the furthest portions of the peripheral part 640 from the corresponding light sources 130 from standing out as dark portions can be achieved.

In the peripheral parts 640, no sectioning member 641 is disposed at the first portions 624. This can hinder the areas near the first portions 624 from standing out as dark portions.

Variation of Fourth Embodiment

A variation of the fourth embodiment will be explained next.

Figure 17:
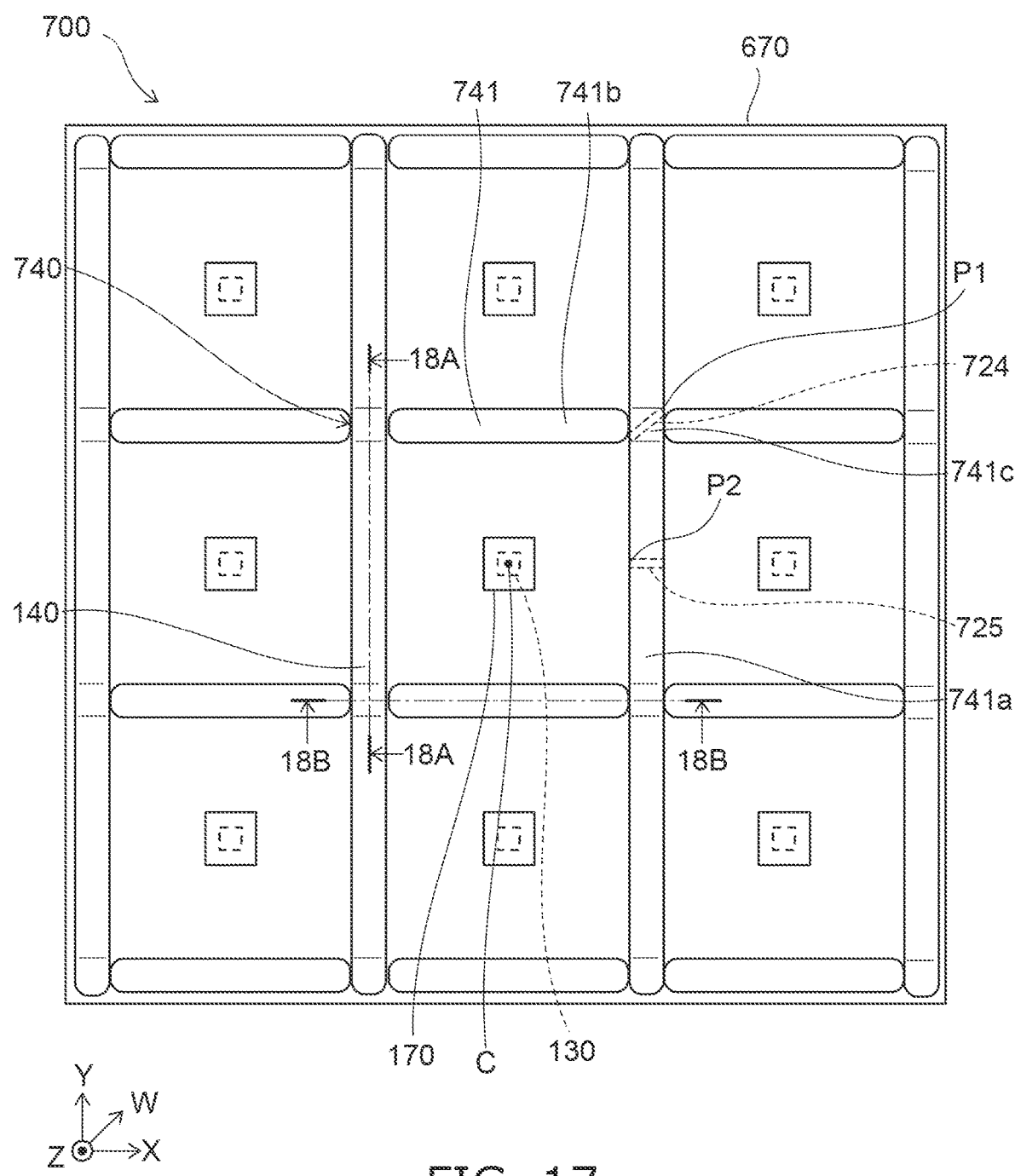
FIG. 17 is a plan view of a planar light source according to a variation of the fourth embodiment.

FIG. 17 is a plan view of a planar light source of this variation.

Figure 18A:
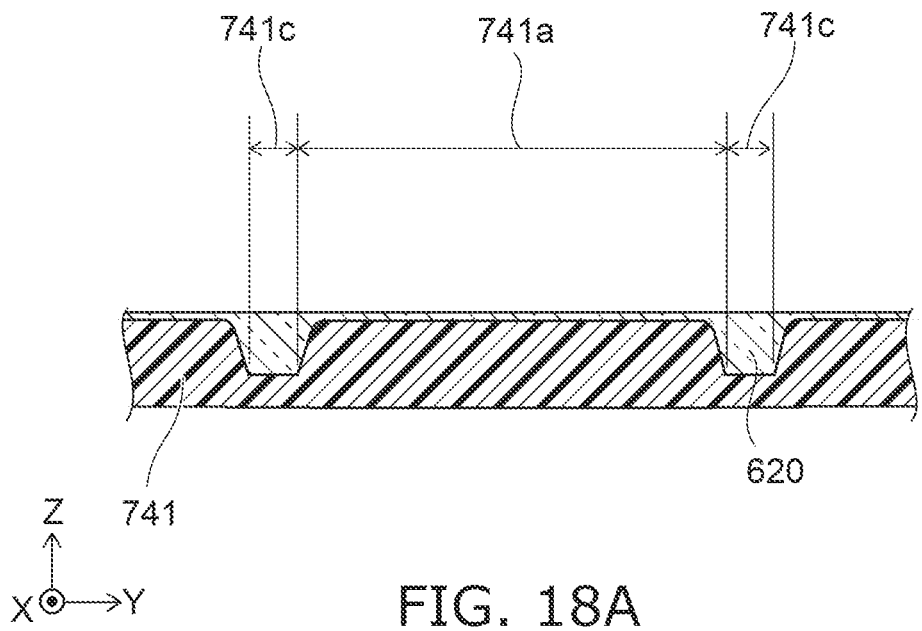
FIG. 18A is a cross-sectional view taken along line 18A-18A in FIG. 17.

FIG. 18A is a cross-sectional view taken along line 18A-18A in FIG. 17.

Figure 18B:
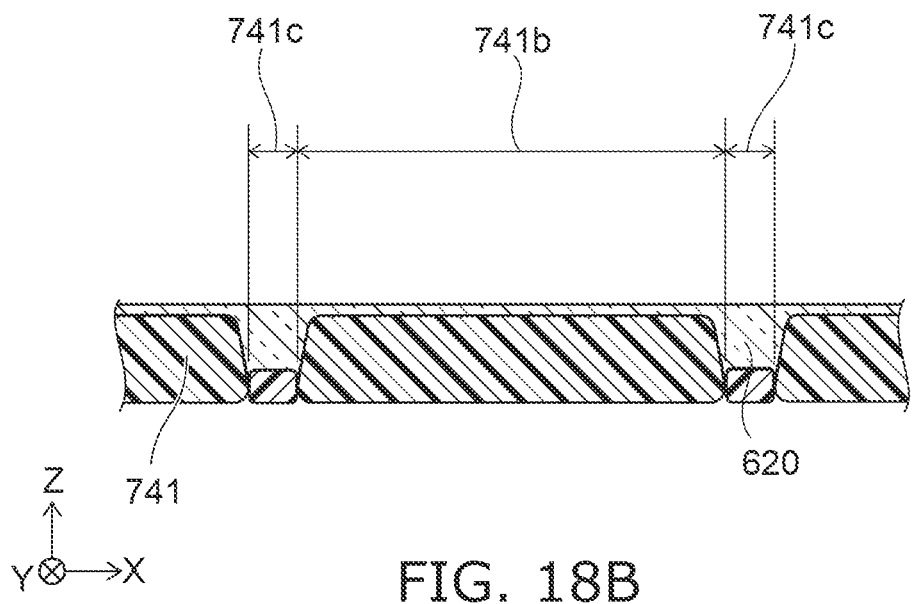
FIG. 18B is a cross-sectional view taken along line 18B-18B in FIG. 17.

FIG. 18B is a cross-sectional view taken along line 18B-18B in FIG. 17.

The planar light source 700 of this variation differs from the planar light source 600 of the fourth embodiment in terms of the structure of the sectioning member 741.

As shown in FIG. 17, in the planar light source 700, a sectioning member 741 that surrounds each light source 130 is provided. A light guide member 620 is disposed directly on the sectioning member 741. However, the light guide member 620 does not have to be disposed directly on the sectioning member 741.

The sectioning member 741 includes first reflecting parts 741a extending in the Y direction and in contact with the light guide member 620, connecting parts 741c connecting adjacent first reflecting parts 741a in the Y direction, and second reflecting parts 741b extending in the X direction.

As shown in FIG. 18A, the thickness of the connecting part 741c (dimension in the Z direction) is smaller than the thickness of the first reflecting part 741a. As shown in FIG. 18B, a second reflecting part 741b is disposed, for example, between two adjacent connecting parts 741c. The thickness of the connecting part 741c is smaller than the thickness of the second reflecting parts 741b. The thickness of the first reflecting part 741a is substantially the same as the thickness of the second reflecting part 741b.

The sectioning member 741 is a resin containing a light reflecting material, for example. Specifically, for the sectioning member 741, a silicone resin or epoxy resin containing titanium oxide as the light reflecting material can be used.

As shown in FIG. 17, a peripheral part 740 includes two first reflecting parts 741a, two second reflecting parts 741b, and extended parts, including four connecting parts 741c, at which the virtual extensions in the Y direction of the ends of the first reflecting parts 741a in the Y direction intersect the virtual extensions in the X direction of the ends of the second reflecting parts 741b in the X direction. In this embodiment, the connecting parts 741c and the light guide member 620 are disposed in the extended parts.

Furthermore, the peripheral part 740 includes a first portion 724 furthest from the center C and a second portion 725 closest from the center C.

A furthest position P1 of the peripheral part 740 furthest from the center C is located at the corner of a connecting part 741c. Accordingly, a first portion 724 is a portion that includes a furthest position P1 and has a thickness in the direction orthogonal to the diagonal direction and the Z direction.

A closest position P2 of a peripheral part 740 closest from the center C is located on the face of a first reflecting part 741a or a second reflecting part 741b that is in contact with the light guide member 620 met by the straight line passing the center C and in parallel to the X direction (or the Y direction) in a plan view. Accordingly, a second portion 725 is, for example, a portion that includes a closest position P2 of the peripheral part 740 and has a thickness in the Y direction.

As described above, the thickness of a connecting part 741c is smaller than the thickness of a first reflecting part 741a and the thickness of a second reflecting part 741b. Accordingly, the thickness of the sectioning member 741 at a first portion 724 is smaller than the thickness of the sectioning member 741 at a second portion 725. The cross-sectional area of the sectioning member 741 in the cross section that includes the center C and a furthest position P1 is smaller than the cross-sectional area of the sectioning member 741 in the cross section that includes the center C and a closest position P2. Accordingly, the transmittance of a first portion 724 is higher than the transmittance of a second portion 725.

The effect of this variation will be explained next.

In the planar light source 700 of this variation, the thickness of the sectioning member 741 at a first portion 724 is smaller than the thickness of the sectioning member 741 at a second portion 725. This can hinder the area near the first portions 724 from standing out as a dark portion.

The cross-sectional area of the sectioning member 741 in the cross section that includes the center C and a furthest position P1 is smaller than the cross-sectional area of the sectioning member 741 in the cross section that includes the center C and a closest position P2. This can make the transmittance of any first portion 724 higher than the transmittance of the second portions 725.

In the embodiments and variations described in the foregoing, examples in which the section defining parts or the peripheral parts form a lattice shape were explained. However, the section defining parts or the peripheral parts do not have to form a lattice shape. For example, the section defining parts or the peripheral parts may be provided such that each light emission region has a polygonal shape other than a quadrangle, such as a triangle or hexagon.

The present invention can be utilized, for example, as a backlight.

What is claimed is:

1. A planar light source comprising:
   a light source,
   a light guide member having a light source placement part in which the light source is disposed and a section defining part having a groove surrounding the light source placement part, and
   a sectioning member having light reflectivity and disposed in the groove, wherein
      a first portion in the section defining part that is furthest from a center of the light source in a plan view has a transmittance higher than a transmittance of a second portion in the section defining part that is closest from the center of the light source.

2. The planar light source according to claim 1, wherein a cross-sectional area of the sectioning member at the first portion is smaller than a cross-sectional area of the sectioning member at a second portion.

3. The planar light source according to claim 1, wherein the sectioning member is not disposed in the first portion.

4. The planar light source according to claim 1, wherein the section defining part has:
- a first extended portion extending in a first direction,
- a second extended portion extending in a second direction intersecting the first direction, and
- a connecting portion connecting the first extended portion and the second extended portion, and wherein
- the first portion is located in a connecting portion, and
- the second portion is located in the first extended portion or the second extended portion.

5. The planar light source according to claim 4, wherein the sectioning member is not disposed in the connecting portion.

6. The planar light source according to claim 4, wherein a lateral face of the groove in the connecting portion connecting a lateral face of the groove in the first extended portion and a lateral face of the groove in the second extended portion is curved in the plan view.

7. The planar light source according to claim 1, wherein a depth of the groove in a cross section of the first portion is smaller than a depth of the groove in a cross section of the second portion.

8. The planar light source according to claim 1, wherein a distance between lateral faces of the groove facing each other in a cross section of the first portion is smaller than a distance between lateral faces of the groove facing each other in a cross section of the second portion.

9. The planar light source according to claim 1, wherein a cross-sectional area of the groove at the first portion is smaller than a cross-sectional area of the groove at the second portion.

10. The planar light source according to claim 1, wherein the groove is not provided in the first portion.

11. The planar light source according to claim 1, wherein
- the groove has a first lateral face and a second lateral face that face each other, and
- the sectioning member has on the first lateral face first light reflecting parts arranged by providing a plurality of first gaps, and on the second lateral face second light reflecting parts arranged by providing a plurality of second gaps,
  - one or more of the first gaps face the second light reflecting parts and one or more of the second gaps face the first light reflecting parts.

12. A planar light source comprising:
- a light source, and
- a peripheral part surrounding the light source and having a sectioning member having light reflectivity, wherein
- the light source is covered by a light guide member,
- the peripheral part has a groove, the sectioning member is disposed in the groove, and
- a first portion in the peripheral part that is furthest from a center of the light source in a plan view has a transmittance higher than a transmittance of a second portion in the peripheral part that is closest from the center of the light source in the plan view.

13. The planar light source according to claim 12, wherein the sectioning member is not disposed in the first portion in the peripheral part.

* * * * *